United States Patent
Zhang et al.

(10) Patent No.: US 12,526,999 B2
(45) Date of Patent: Jan. 13, 2026

(54) THREE-DIMENSIONAL MEMORY DEVICE AND FABRICATION METHOD THEREOF

(71) Applicant: YANGTZE MEMORY TECHNOLOGIES CO., LTD., Wuhan (CN)

(72) Inventors: Zhong Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/624,578

(22) Filed: Apr. 2, 2024

(65) Prior Publication Data
US 2024/0251558 A1 Jul. 25, 2024

Related U.S. Application Data

(63) Continuation of application No. 17/090,531, filed on Nov. 5, 2020, now Pat. No. 11,980,030, which is a
(Continued)

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC .................................................... H10B 43/35
See application file for complete search history.

(56) References Cited

U.S. PATENT DOCUMENTS

| 9,397,043 | B1 | 7/2016 | Minemura |
| 2014/0264549 | A1 | 9/2014 | Lee |

(Continued)

FOREIGN PATENT DOCUMENTS

| CN | 106910746 A | * | 6/2017 | ....... H01L 21/76802 |
| CN | 109346471 A |  | 2/2019 | |

(Continued)

OTHER PUBLICATIONS

The World Intellectual Property Organizatino (WIPO), International Seach Report for PCT/CN2020/114830, dated Jun. 9, 2021, 5 pages.

*Primary Examiner* — Alia Sabur
(74) *Attorney, Agent, or Firm* — BAYES PLLC

(57) ABSTRACT

In one aspect, a three-dimensional (3D) memory device includes a first core region, a second core region, and an isolation region between the first and second core regions along a first direction, a stack in the first and second core regions and including alternatingly stacked first dielectric layers and conductor layers, gate line slit structures extending through the stack along a second direction perpendicular to the first direction in the first and second core regions, top select gate (TSG) cut structures extending through a portion of the stack along the second direction, and a first isolation structure extending through the stack along the second direction in the isolation region and contacting with the gate line slit structures. The gate line slit structures and the TSG cut structures extend along the first direction. One of the TSG cut structures is between two of the gate line slit structures along a third direction perpendicular to the first direction and the second direction.

20 Claims, 15 Drawing Sheets

Related U.S. Application Data continuation of application No. PCT/CN2020/104830, filed on Sep. 11, 2020.

(51) Int. Cl.
    *H10B 41/27*     (2023.01)
    *H10B 43/10*     (2023.01)

(56) References Cited

U.S. PATENT DOCUMENTS

| | | |
|---|---|---|
| 2017/0309634 A1 | 10/2017 | Noguchi et al. |
| 2017/0358593 A1 | 12/2017 | Yu et al. |
| 2019/0057974 A1* | 2/2019 | Lu .................. H01L 23/5226 |
| 2019/0081059 A1 | 3/2019 | Xu et al. |
| 2019/0237475 A1* | 8/2019 | Jung .................. H10D 30/694 |
| 2020/0066742 A1 | 2/2020 | Kim et al. |
| 2020/0119032 A1* | 4/2020 | Hu .................. H10B 43/10 |
| 2020/0119036 A1 | 4/2020 | King et al. |
| 2021/0043504 A1 | 2/2021 | Chandolu et al. |

FOREIGN PATENT DOCUMENTS

| | | |
|---|---|---|
| CN | 110828470 A | 2/2020 |
| TW | 202008563 A | 2/2020 |
| TW | 202032767 A | 9/2020 |

\* cited by examiner

THREE-DIMENSIONAL MEMORY DEVICE AND FABRICATION METHOD THEREOF

CROSS-REFERENCE TO RELATED APPLICATIONS

This application is a continuation of U.S. application Ser. No. 17/090,531, filed on Nov. 5, 2020, and titled "THREE-DIMENSIONAL MEMORY DEVICE AND FABRICATION METHOD THEREOF," which is a continuation of International Application No. PCT/CN2020/104830, filed on Sep. 11, 2020, both of which are incorporated herein by reference in their entireties.

FIELD OF THE TECHNOLOGY

This application relates to the field of semiconductor technology and, specifically, to a three-dimensional (3D) memory device and fabrication method thereof.

BACKGROUND OF THE DISCLOSURE

A NAND memory is a non-volatile type of memory that does not require power to retain stored data. The growing demands of consumer electronics, cloud computing, and big data bring about a constant need for NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

A 3D NAND structure is built on a substrate of a memory die. The 3D NAND structure includes multiple memory planes, each memory plane includes multiple memory blocks, and each memory block includes a great number of NAND memory cells. The memory planes are effective areas of the memory die. It is desirable to increase the effective area of the memory die, or to increase the percentage of the die area used for the memory plane.

The disclosed devices and methods are directed to solve one or more problems set forth above and other problems.

SUMMARY

In one aspect of the present disclosure, a 3D NAND memory device includes a substrate, core regions, isolation regions, a layer stack, channel structures, and an isolation structure. The core regions and isolation regions are arranged over the substrate. Each core region is surrounded by one or more of the isolation regions. The layer stack is formed in each core region over the substrate and includes first dielectric layers and conductor layers that are alternatingly stacked over each other. The channel structures are formed through the layer stack over the substrate. The isolation structure is formed over the substrate in at least a part of the one or more of the isolation regions. The isolation structure includes second dielectric layers and third dielectric layers that are alternatingly stacked over each other.

In another aspect of the present disclosure, a fabrication method for a 3D NAND memory device includes providing a substrate for the 3D memory device, arranging core regions and isolation regions over the substrate, forming in each core region a layer stack that includes first dielectric layers and second dielectric layers, forming channel structures through the layer stack over the substrate, etching partially the first dielectric layers to form an isolation structure in at least a part of the one or more of the isolation regions, and filling cavities left by etching partially the first dielectric layers with an electrically conductive material to form conductor layers. Each core region is surrounded by one or more of the isolation regions. The first dielectric layers and second dielectric layers are stacked over each other alternately. The isolation structure includes third dielectric layers and fourth dielectric layers that are stacked over each other alternatingly.

In another aspect of the present disclosure, a 3D NAND memory device includes a substrate, a layer stack, channel structures, gate line slit structures, and a dummy channel hole structure. The layer stack is formed over the substrate and includes first dielectric layers and conductor layers that are alternatingly stacked over each other. The channel structures are formed through the layer stack over the substrate. The gate line slit structures are formed through the layer stack in a vertical direction over the substrate and in parallel with each other along a first lateral direction with respect to the substrate. The dummy channel hole structure is formed through the layer stack over the substrate, adjoins an end of one of the gate line slit structures, and extends away from the end over a distance that is related to a configuration of adjacent gate line slit structures.

Other aspects of the present disclosure can be understood by those skilled in the art in light of the description, the claims, and the drawings of the present disclosure.

BRIEF DESCRIPTION OF THE DRAWINGS

FIG. 19-1 illustrates a top view of another exemplary portion of the 3D memory device shown in FIGS. 4 and 5 after certain fabrication steps according to various embodiments of the present disclosure;

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1A:
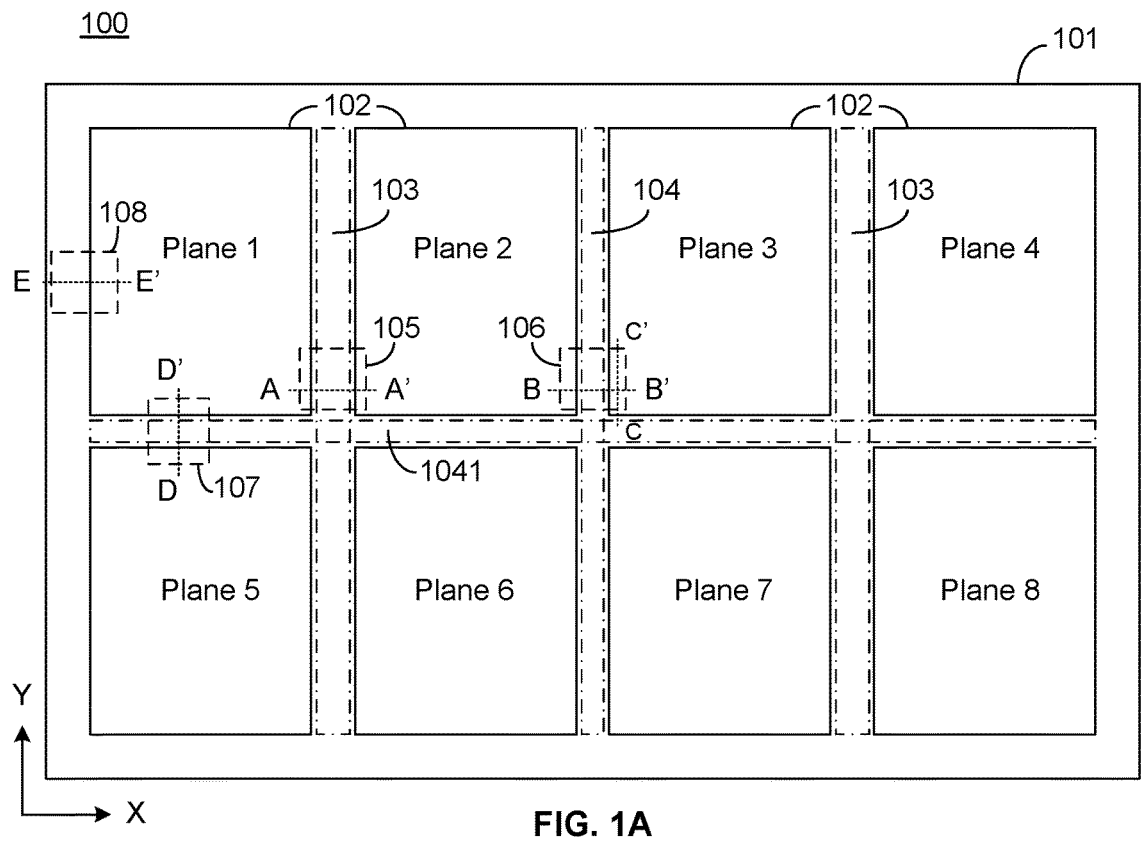
FIGS. 1A and 1B illustrate top views of an exemplary three-dimensional (3D) memory device according to various embodiments of the present disclosure.
Figure 1B:
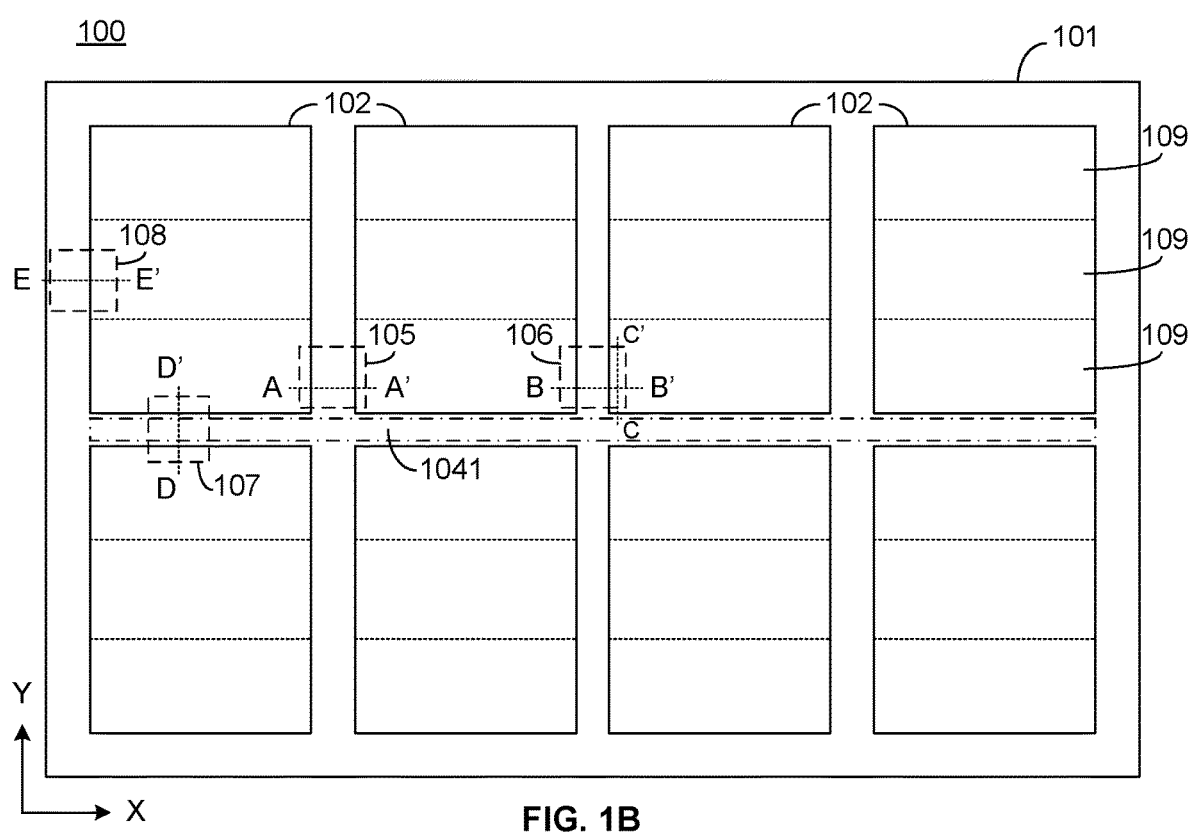

FIGS. 1A, 1, and 2-16 schematically show fabrication processes of an exemplary 3D memory device 100 according to embodiments of the present disclosure. Among the figures, top views are in an X-Y plane and cross-sectional views are in an X-Z plane or a Y-Z plane. As shown in FIGS. 1A and 1B, the 3D memory device 100 includes a 3D memory die 101. The die 101 may include multiple memory planes 102 that may form a 2D array along the X direction and Y direction with respect to the substrate. The planes 102 may exemplarily include planes 1-8 as illustrated in FIG. 1A, although any number, more or less than 8, of planes may be included in the disclosed memory die. The memory planes may be considered as the core regions of the 3D memory device 100.

Memory planes are often separated from each other by a dielectric layer in a staircase region or a dummy staircase region. The dielectric layer is arranged between staircase structures or between dummy staircase structures. A memory plane may need a staircase structure for configuring word line contacts. As dummy staircase structures do not provide any function, a dummy staircase region may be replaced by an isolation region that occupies a smaller area. As disclosed, isolation regions 104 and 1041, which do not contain dummy staircase structures, may be formed in the die 101. Since the isolation regions 104 and 1041 occupy a smaller area than a dummy staircase region, as illustrated in descriptions below, the effective die area and memory density of the 3D memory device 100 may be increased. In some embodiments, the die 101 may include two staircase regions 103 and isolation regions 104 and 1041, instead of staircase regions 103 and dummy staircase regions, to electrically isolate the memory planes 102 from each other. The isolation regions 103 and 104 extend between memory planes along the Y direction, and the isolation region 1041 extends between memory planes along the X direction. For example, the planes 1 and 2 may be separated by the staircase region 103, the planes 2 and 3 may be separated by the isolation region 104, and the planes 1 and 5 may be separated by the isolation region 1041.

As shown in FIGS. 1A and 1i, the die 101 may include regions 105, 106, 107, and 108. Different structures may be formed in the regions 105-108. Cross-sectional views along lines AA' of the region 105, BB' of the region 106, CC' of the region 106, DD' of the region 107, and EE' of the region 108 are illustrated in description below in the present disclosure. Additionally, each memory plane 102 may include multiple memory blocks, such as memory blocks 109 as shown in FIG. 1. In some embodiments, memory cells in a memory block may be reset together in a block erase operation. For illustration purposes, configurations, patterns, and/or numbers of the memory planes 102 and/or memory blocks 109 illustrated in FIGS. 1A and 1B are exemplary, and any other suitable configurations, patterns, and/or numbers of the memory planes and/or memory blocks may be included in the disclosed memory die.

Figure 2:
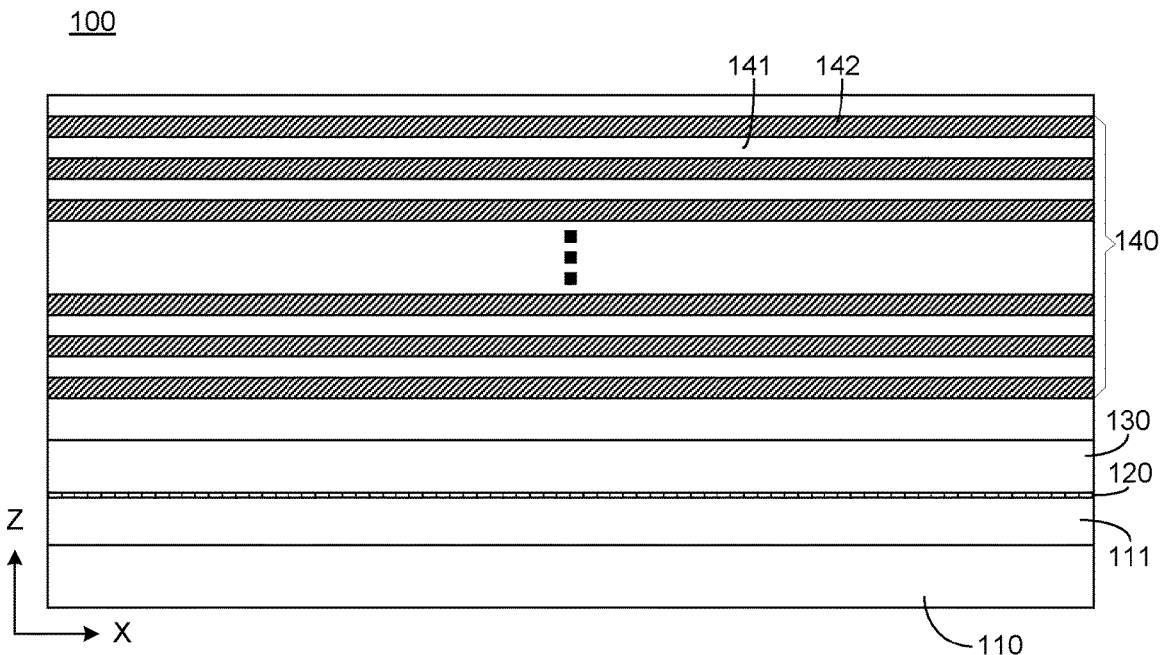
FIG. 2 illustrates a cross-sectional view of the 3D memory device shown in FIGS. 1A and 1B at certain stages during an exemplary fabrication process according to various embodiments of the present disclosure.

FIG. 2 illustrates a cross-sectional structure in an X-Z plane of the 3D memory device 100 according to embodiments of the present disclosure. The 3D memory device 100 or the die 101 may include a substrate 110. In some embodiments, the substrate 110 may include a single crystalline silicon layer. In some other embodiments, the substrate 110 may include a semiconductor material, such as germanium (Ge), silicon-germanium (SiGe), silicon carbide (SiC), silicon-on-insulator (SOI), germanium-on-insulator (GOI), polycrystalline silicon (polysilicon), or a Group III-V compound such as gallium arsenide (GaAs) or indium phosphide (InP). In some other embodiments, the substrate 110 may include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer.

In some embodiments, a top portion of the substrate 110 may be doped by n-type dopants via ion implantation and/or diffusion to form a doped region 111. The dopants of the doped region 111 may include, for example, phosphorus (P), arsenic (As), and/or antimony (Sb). As shown in FIG. 2, a cover layer 120 may be deposited over the doped region 111. The cover layer 120 is a sacrificial layer and may include a single layer, a multi-layer, or a suitable composite layer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other embodiments, the cover layer 120 may include another material such as aluminum oxide.

Over the cover layer 120, a sacrificial layer 130 may be deposited. The sacrificial layer 130 may include a dielectric material, a semiconductor material, or a conductive material. An exemplary material for the sacrificial layer 130 is polysilicon.

After the polysilicon sacrificial layer 130 is formed, a layer stack 140 may be formed. The layer stack 140 includes multiple pairs of stack layers, for example, including a plurality of first dielectric layers 141 and a plurality of second dielectric layers 142, stacked alternately over each other. For example, the layer stack may include 64 pairs, 128 pairs, or more than 128 pairs of the first and second dielectric layers 141 and 142.

In some embodiments, the first dielectric layers 141 and the second dielectric layers 142 may be made of different materials. For example, the different materials may include silicon oxide and silicon nitride. In some embodiments, the first dielectric layers 141 includes a silicon oxide layer, which may be used as an isolation stack layer, while the second dielectric layers 142 includes a silicon nitride layer, which may be used as a sacrificial stack layer. The sacrificial stack layer may be subsequently etched out and replaced by a conductor layer. The first dielectric layers 141 and the second dielectric layers 142 may be deposited via CVD, PVD, ALD, or a combination thereof.

Figure 3:
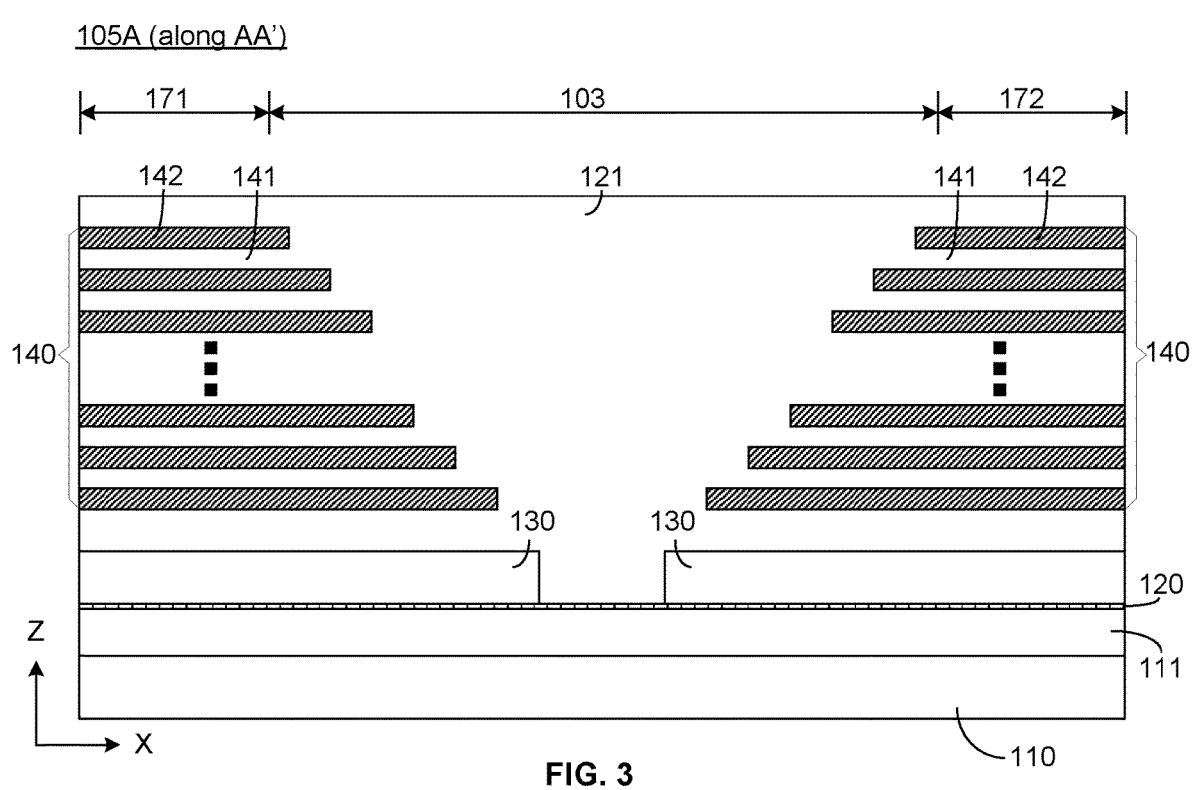
FIG. 3 illustrates a cross-sectional view of an exemplary portion of the 3D memory device shown in FIG. 2 at certain stage during the exemplary fabrication process according to various embodiments of the present disclosure.

FIG. 3 shows a schematic cross-sectional structure in an X-Z plane (i.e., a structure 105A) of the 3D memory device 100 according to embodiments of the present disclosure. The cross-sectional view shown in FIG. 3 is taken along the line AA' of FIG. 1A. After the layer stack 140 is formed, a staircase formation process may be performed to trim some parts of the layer stack 140 (e.g., a portion in a staircase region 103) into staircase structures. Any suitable etching process, including dry etch and/or wet etch processes, may be used in the staircase formation process. Two staircase structures may be formed by the etching process in the staircase region 103. The height of the staircase structure on the right side may increase in a stepwise manner along the X direction, while the height of the staircase structure on the left side may decrease in a stepwise manner along the X direction. Channel hole regions 171 and 172 are next to the staircase region 103, respectively. A dielectric layer 121 is deposited to cover the two staircase structures and isolate the planes 1 and 2.

Figure 4:
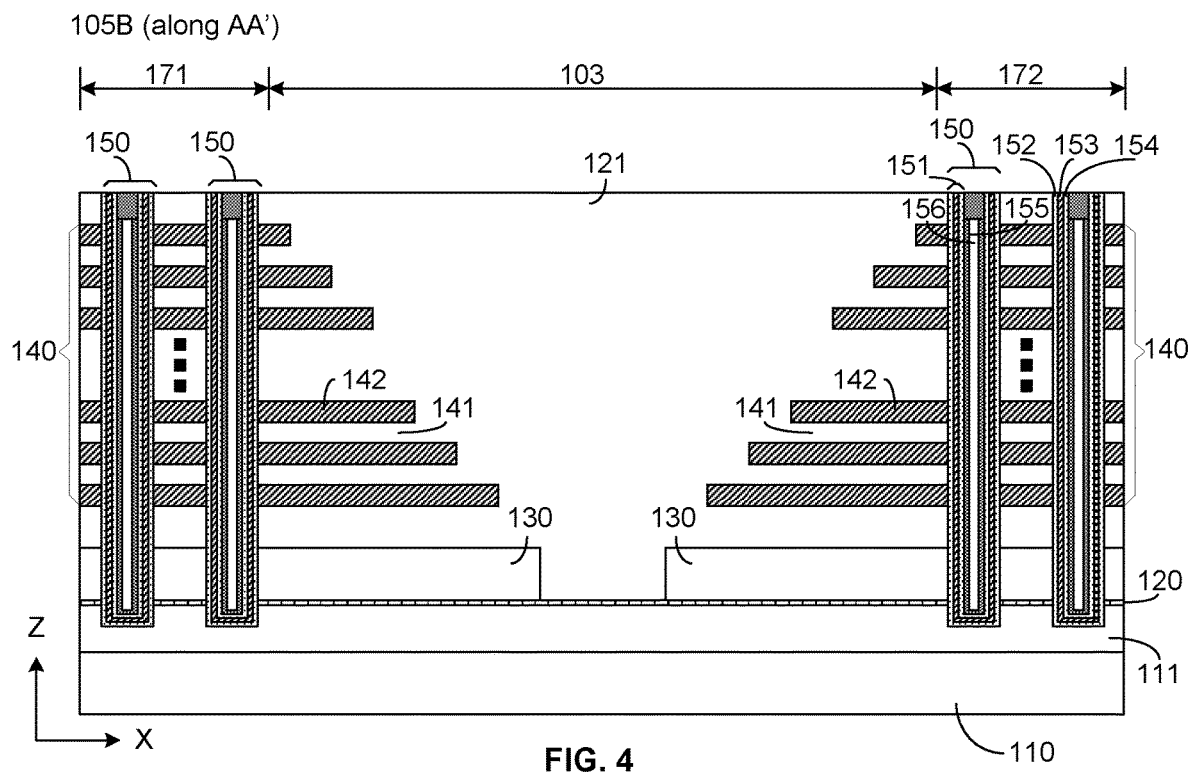
FIGS. 4 and 5 illustrate cross-sectional views of exemplary portions of the 3D memory device shown in FIG. 3 after channel holes are formed according to various embodiments of the present disclosure.
Figure 5:
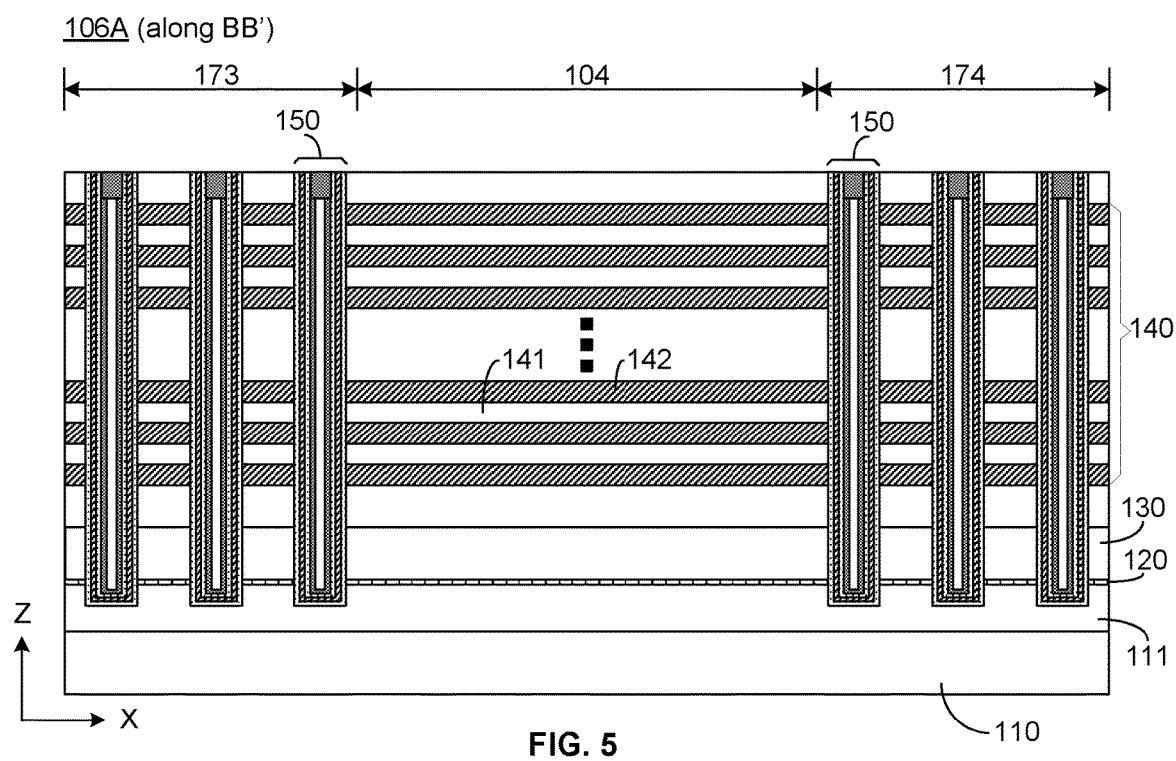

FIGS. 4 and 5 show schematic cross-sectional structures in X-Z planes (i.e., structures 105B and 106A) of the 3D memory device 100 after channel holes 150 are formed and then filled with layer structures according to embodiments of the present disclosure. The cross-sectional views shown in FIGS. 4 and 5 are taken along the lines AA' and BB' of FIG. 1A, respectively. In the structure 105B of FIG. 4, the channel holes 150 are formed in the channel hole regions 171 and 172, and the staircase region 103 is formed between the channel hole regions 171 and 172. In the structure 106A of FIG. 5, the channel holes 150 are formed in the channel hole regions 173 and 174, and the isolation region 104 is formed between the channel hole regions 173 and 174. The quantity, dimension, and arrangement of the channel holes 150 shown in FIGS. 4 and 5 and in other figures in the present disclosure are exemplary and for description purposes, although any suitable quantity, dimension, and arrangement may be used for the disclosed 3D memory device 100 according to various embodiments of the present disclosure.

The channel holes 150 are configured to extend in the Z direction or in a direction approximately perpendicular to the substrate 110 and form an array of a predetermined pattern (not shown) in the X-Y plane. FIGS. 4 and 5 only illustrate some of the channel holes 150 that are in the cross sections in the X-Z planes.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer 130, the cover layer 120, and partially penetrates the doped region 111. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trap layer 153 on a surface of the blocking layer 152 to store charges during an operation of the 3D memory device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, another wide bandgap material, etc. The charge trap layer 153 may include one or more layers that may include one or more materials. The materials for the charge trap layer 153 may include polysilicon, silicon nitride, silicon oxynitride, nanocrystalline silicon, another wide bandgap material, etc. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, another wide bandgap material, etc.

In some embodiments, the functional layer 151 may include an oxide-nitride-oxide (ONO) structure. In some other embodiments, however, the functional layer 151 may have a structure different from the ONO configuration. When the ONO structure is used, the functional layer 151 may include a silicon oxide layer, a silicon nitride layer, and another silicon oxide layer.

As shown in FIG. 4, the blocking layer 152 may be, e.g., a silicon oxide layer deposited on the sidewall of the channel hole 150. The charge trap layer 153 may be, e.g., a silicon nitride layer deposited on the blocking layer 152. The tunnel insulation layer 154 may be, e.g., another silicon oxide layer deposited on the charge trap layer 153. A channel layer 155, also referred to as a "semiconductor channel", may be, e.g., a polysilicon layer deposited on the tunnel insulation layer 154. In some other embodiments, the channel layer 155 may include amorphous silicon. Like the channel holes, the channel layers 155 also extend through the layer stack 140 and into the doped region 111. As shown in FIGS. 4 and 5, a portion of each functional layer 151 is configured between a portion of one of the first and second dielectric layers 141 and 142 and a portion of one of the channel layers 155. The blocking layer 152, the charge trap layer 153, the tunnel insulation layer 154, and the channel layer 155 may be deposited by, e.g., CVD, PVD, ALD, or a combination of two or more of these processes. The channel holes 150 may be filled by an oxide material 156 after the channel layers 155 are formed. The structure formed in a channel hole 150, including the functional layer 151 and channel layer 155, may be considered as a channel structure.

In the process described above, the channel holes 150 are etched after the staircase structures are formed. In some other embodiments, the channel holes 150 may be formed before the staircase formation process. For example, after the layer stack 140 is fabricated as shown in FIG. 2, the channel holes 150 may be formed and then the functional layer 151 and the channel layer 155 may be deposited. After the channel holes 150 are filled with the oxide material 156, the staircase formation process may be performed to form the staircase structures in the staircase regions 103.

Figure 6:
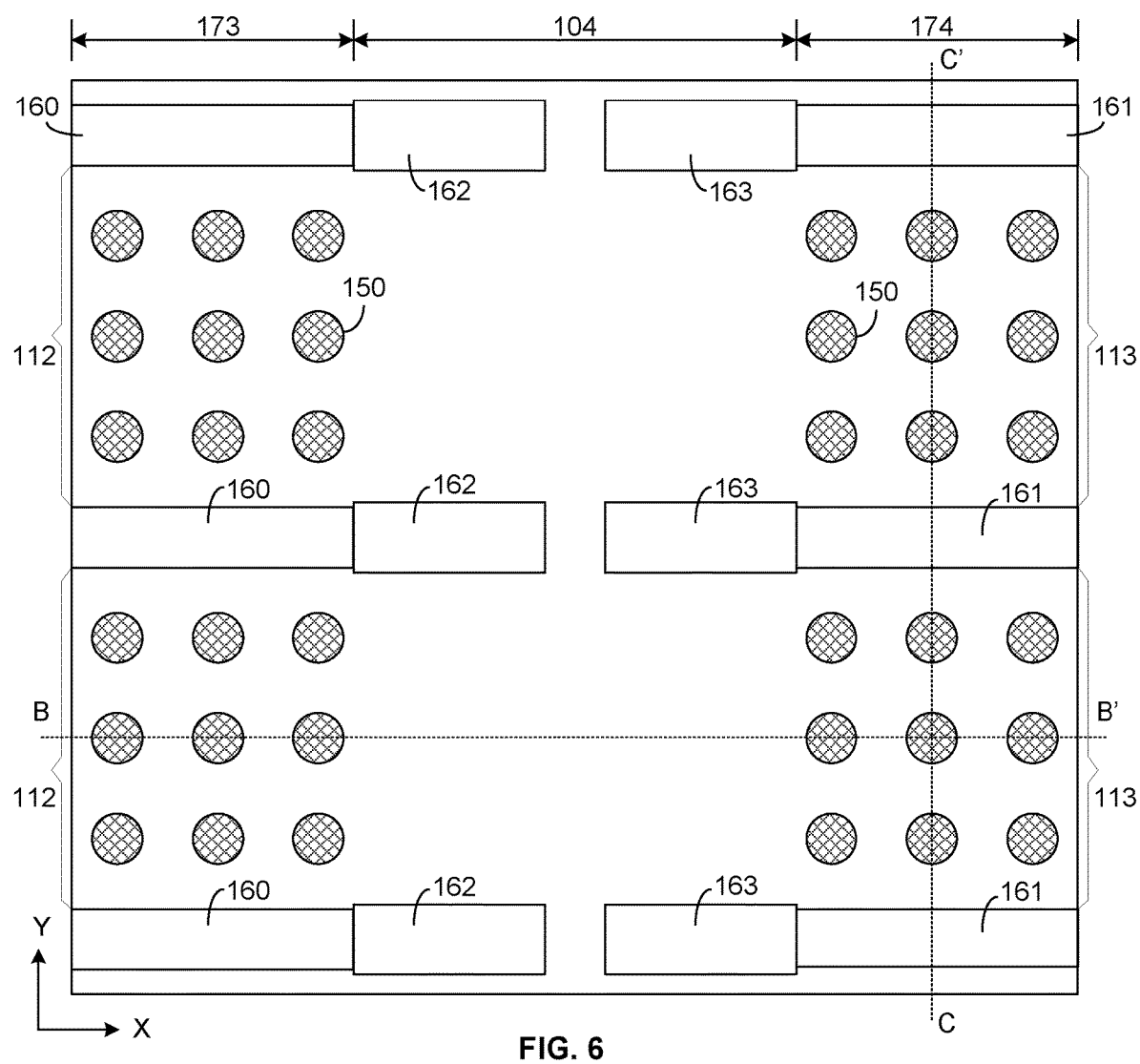
FIG. 6 illustrates a top view of an exemplary portion of the 3D memory device shown in FIGS. 4 and 5 after dummy channel holes and gate line slits are formed according to various embodiments of the present disclosure.
Figure 7:
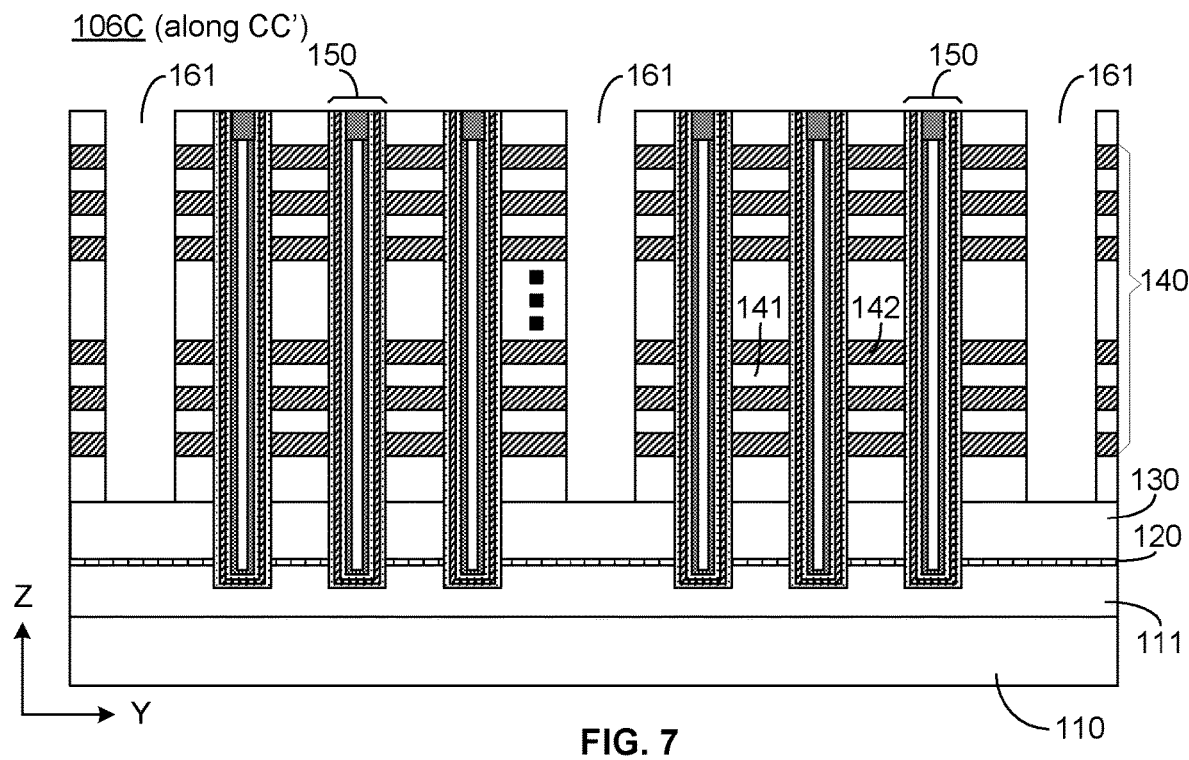
FIG. 7 illustrates a cross-sectional view of an exemplary portion of the 3D memory device shown in FIGS. 4 and 5 after dummy channel holes and gate line slits are formed according to various embodiments of the present disclosure.

FIGS. 6 and 7 show a schematic top view in an X-Y plane and a schematic cross-sectional structure in an X-Z plane (i.e., structures 106B and 106C) of the 3D memory device 100 after gate line slits 160 and 161 are formed according to embodiments of the present disclosure. FIG. 6 is an enlarged view of the region 106 of FIG. 1A at a certain stage. The cross-sectional view shown in FIG. 7 is taken along the line CC' of FIGS. 1A and 6. The 3D memory device 100 may have a great number of NAND memory cells configured in the layer stack 140 or residing in the layer stack 140. As described above, the die 101 may be divided into memory planes 102. Each memory plane 102 may be divided into memory blocks 109 and memory fingers (e.g., memory fingers 112 and 113) by gate line slits (e.g., the gate line slits 160 and 161). A gate line slit may also be referred to as a gate line slit structure. The gate line slits 160 and 161 are formed extending along a first lateral direction with respect to the substrate, e.g., the X direction as shown in FIG. 6. The region 106 as shown in FIGS. 1B and 6 includes a portion of one memory block 109 and a portion of another memory block 109. Each memory block 109 may contain memory fingers that are separated by gate line slits. For example, the portion of the memory block 109 may be divided into memory fingers 112 by the gate line slits 160. The channel holes 150 of the memory finger 112 may be arranged between the gate line slits 160. Similarly, the channel holes 150 of the memory finger 113 may be arranged between the gate line slits 161. The arrangement and pattern of the channel holes 150 and the gate line slits 160 and 161 as shown in FIGS. 6 and 7 are exemplary and for description of the structure and fabrication of the 3D memory device 100.

Before the gate line slits 160 and 161 are formed, dummy channel holes 162 and 163 may be fabricated. The dummy channel holes 162 and 163 and gate line slits 160 and 161 together may provide electrical insulation to separate adjacent memory fingers (or adjacent memory blocks). Dummy channel holes may also be referred to as dummy channel hole structures. The dummy channel holes 162 and 163 may be an insulating structure formed by one or more dielectric materials such as silicon oxide. In some embodiments, the dummy channel holes 162 and 163 may have a regular shape such as a rectangle in the X-Y plane. In some embodiments, the dummy channel holes 162 and 163 may have an irregular shape in the X-Y plane. Take the dummy channel hole 162 for example. As shown in FIG. 6, in some embodiments, a gate line slit 160 and the dummy channel hole 162 may be parallel, aligned, and adjoined. The gate line slit 160 may start from a first position (not shown) in the plane 2 and extend to a second position at the edge of the channel hole region 173 along the first lateral direction, i.e., the X direction. A corresponding dummy channel hole 162 may join the gate line slit at the second position and extend from the second position toward the plane 3 along the X direction. The length of the dummy channel hole 162 along the X direction may be determined by the arrangement of the channel holes 150 and the gate line slits 160. Similar to the channel holes 150, in the Z direction, the dummy channel holes 162 may extend through the layer stack 140 and into the doped region 111. For a gate line slit that separates adjacent memory blocks (not shown), a corresponding dummy channel hole may have a similar structure to that of the dummy channel hole 162.

The gate line slits 160 and 161 may be formed by, e.g., a dry etch process or a combination of dry and wet etch processes. As shown in FIG. 7, the gate line slits 161 may extend through the layer stack 140 and reach or partially penetrate the sacrificial layer 130 in the Z direction or in a direction approximately perpendicular to the substrate 110. As such, at the bottom of the gate line slit 161, the sacrificial layer 130 is exposed. Then, spacer layers (not shown) may be deposited on the sidewall and bottom of the gate line slits 161 by CVD, PVD, ALD, or a combination of two or more of these processes. The spacer layers are configured to protect the first and second dielectric layers 141 and 142 and may include, for example, silicon oxide and silicon nitride.

After the spacer layers are deposited, selective etching may be performed such that parts of the spacer layers at the bottom of the gate line slits 161 are removed by dry etch or a combination of dry etch and wet etch. Then, the sacrificial layer 130 is exposed again. Subsequently, a selective etch process, e.g., a selective wet etch process, may be performed to remove the sacrificial layer 130. Removal of the sacrificial layer 130 creates a cavity and exposes the cover layer 120 and bottom portions of the blocking layers 152 formed in the channel holes 150. Next, multiple selective etch processes, e.g., multiple selective wet etch processes, may be performed to remove the exposed portions of the blocking layer 152, the charge trap layer 153, and the tunnel insulation layer 154 consecutively, which exposes bottom side portions of the channel layer 155.

In some embodiments, the cover layer 120 may be silicon oxide. Then, the cover layer 120 may be removed when the bottom portions of the functional layers 151 are etched away. In some other embodiments, the cover layer 120 may include a material other than silicon oxide or silicon nitride. Then, the cover layer 120 may be removed by one or more additional selective etch processes. Removal of the cover layer 120 exposes the top surface of the doped region 111.

As such, after the etch processes described above, the doped region 111 and side portions of the channel layers 155 close to the bottom of the channel hole 150 are exposed in the cavity left by etching away the sacrificial layer 130 and the cover layer 120. The cavity may be filled by a semiconductor material, e.g., polysilicon, to form a semiconductor layer 131, e.g., by a CVD and/or PVD deposition process. The semiconductor layer 131 may be n-doped, formed on the exposed surface of the doped region 111 and on sidewalls or side portions of the channel layers 155, and electrically connected to the doped region 111 and the channel layers 155.

In some other embodiments, a selective epitaxial growth may be performed such that a layer of single crystalline silicon may be grown on the exposed surface of the doped region 111 and a polysilicon layer may be grown on the exposed surface of the channel layer 155. As such, the semiconductor layer 131 may include adjoined layers of single crystalline silicon and polysilicon.

Figure 8:
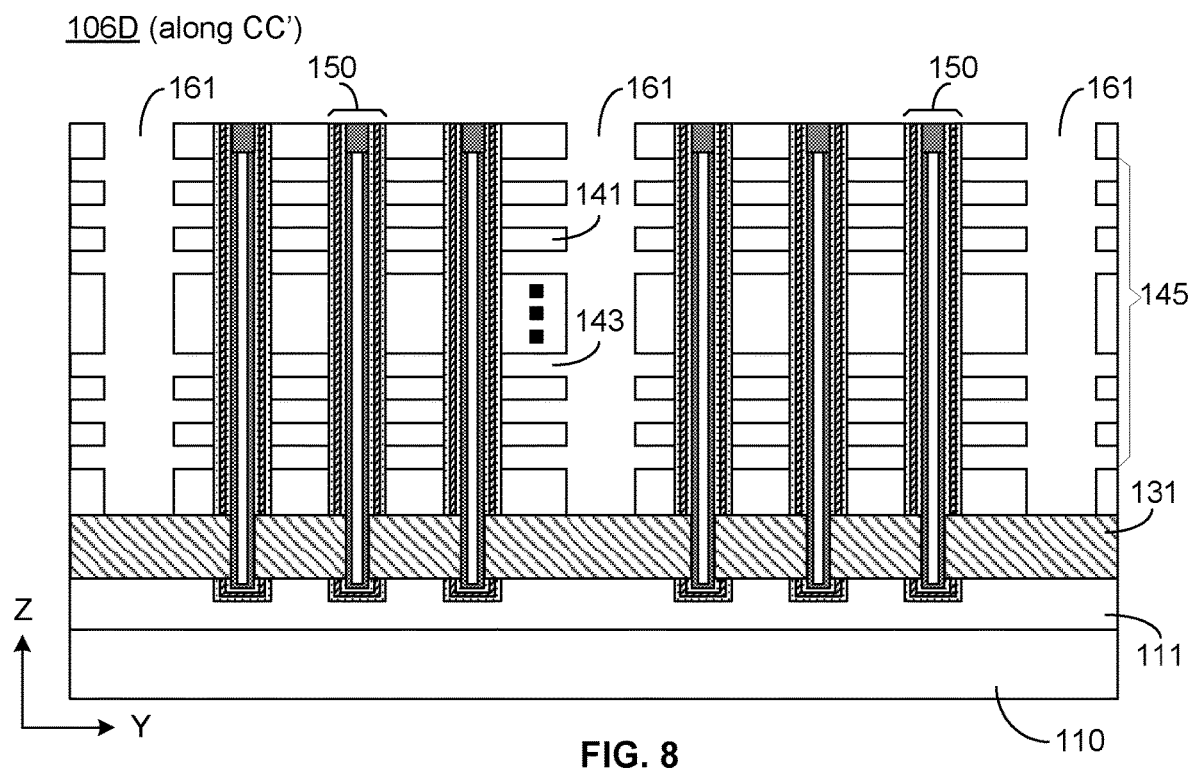
FIGS. 8, 9, and 10 illustrate cross-sectional views of exemplary portions of the 3D memory device shown in FIGS. 6 and 7 at certain stage according to various embodiments of the present disclosure.
Figure 9:
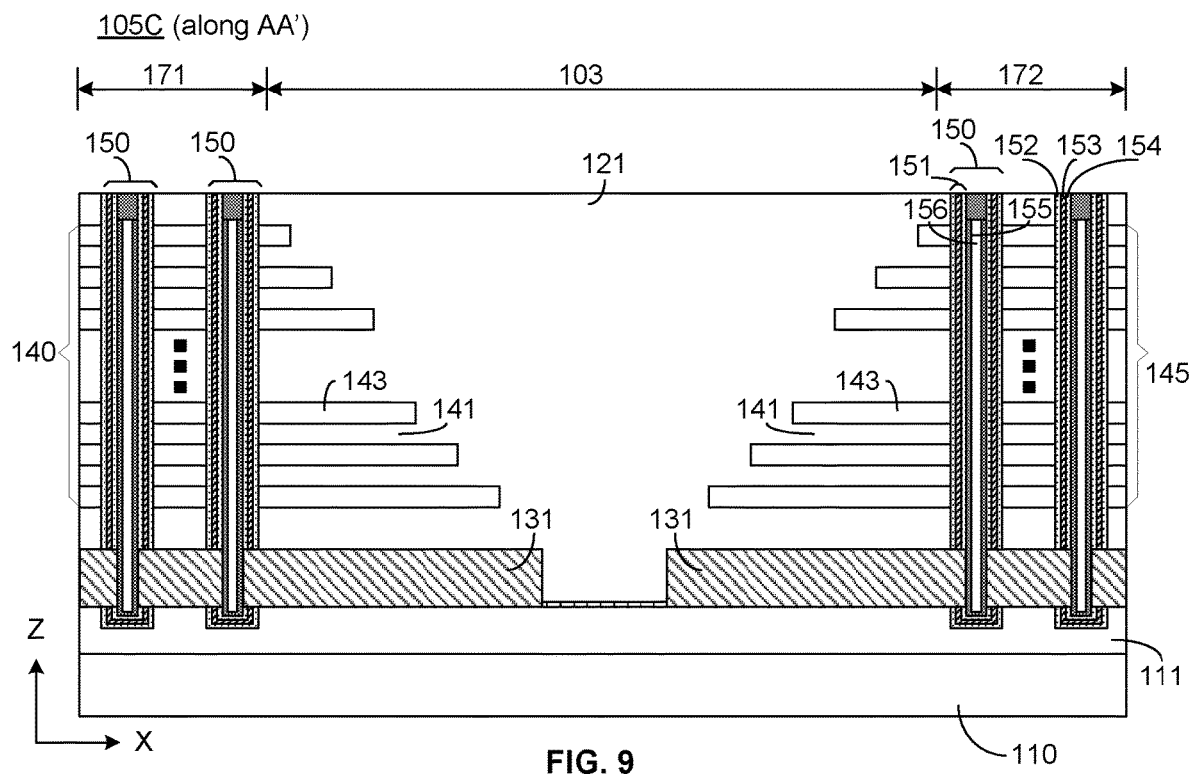
Figure 10:
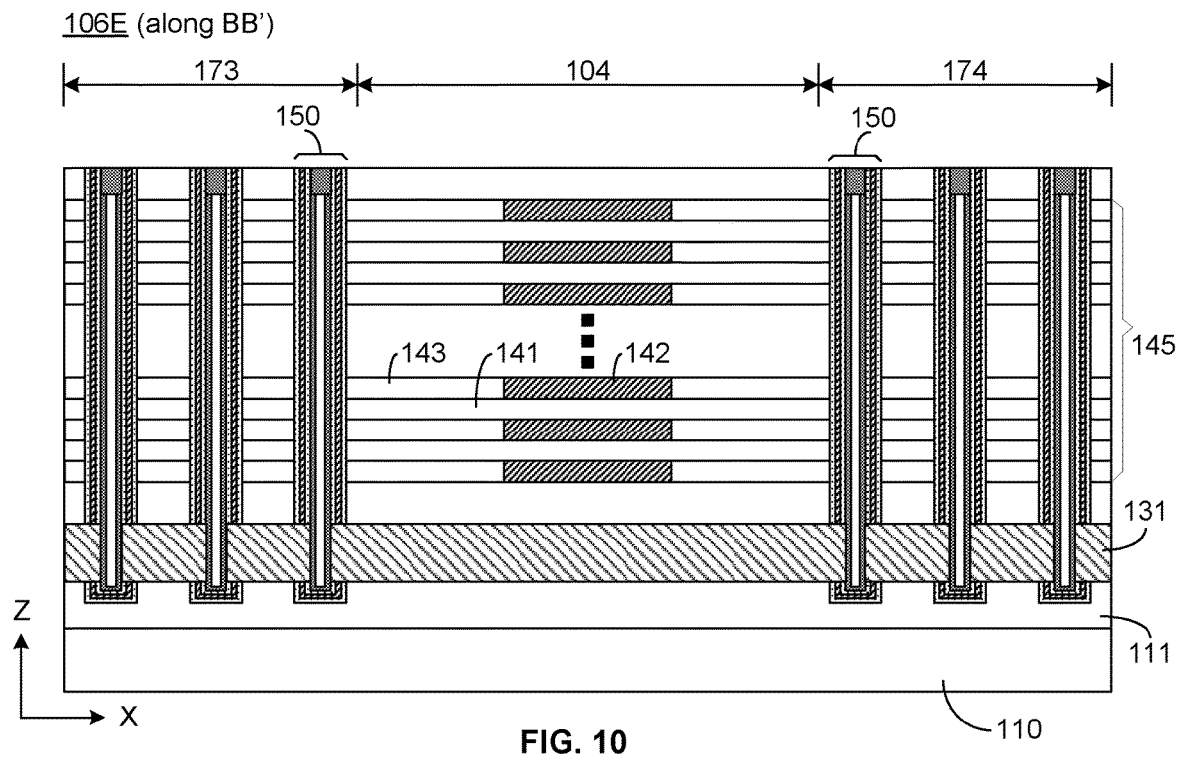

When the bottom parts of the functional layer 151 and the cover layer 120 are etched, some spacer layers may be etched away, and the rest spacer layers may remain on the sidewall of the gate line slits 160 and 161 to protect the first and second dielectric layers 141 and 142. After the semiconductor layer 131 is formed, the remaining spacer layers may be removed in a selective etch process, e.g., a selective wet etch process, which exposes the sides of the second dielectric layer 142 around the gate line slits 160 and 161. In some embodiments, the innermost spacer layer, which is in contact with the sidewall, is silicon nitride. Because the second dielectric layers 142 are also silicon nitride layers, the innermost spacer layer and the second dielectric layers 142 may be removed together during the etch process, leaving cavities 143 between the first dielectric layers 141, as shown in FIGS. 8, 9, and 10. As such, the layer stack 140 is changed into a layer stack 145. FIGS. 8-10 are exemplary cross-sectional views of structures 106D, 105C, and 106E that are taken along the lines CC', AA', and BB', respectively. The line AA' refers to FIG. 1A and the lines BB' and CC' refer to FIGS. 1A and 6.

As shown in FIGS. 8 and 9, the second dielectric layers 142 are etched away completely in the structures 106D and 105C. However, as shown in FIG. 10, certain portions of the second dielectric layers 142, which are in the middle of the isolation region 104, are not etched out. For example, when the second dielectric layers 142 are etched, the etch time may be arranged long enough such that the second dielectric layers 142 that are in a memory finger and between two gate line slits (e.g., between the gate line slits 160 or 161) are removed completely, but the etch time may not be long enough to etch away certain portions of the second dielectric layers 142 that are between two planes, e.g., in the middle of the isolation region 104 of FIG. 10. The remaining portions of the second dielectric layer 142 and some portions of the first dielectric layer 141 may form a layered isolation structure that separates the plane 2 from the plane 3 in the middle of the isolation region 104. In the X-Y plane, the layered isolation structure may extend along a direction parallel to the substrate 110, e.g., extending between the planes 2 and 3 along the Y direction. Thus, in the X-Y plane, the direction along which the layered isolation structure extends between the planes 2 and 3 and the first lateral direction (i.e., the X direction) may be perpendicular or approximately perpendicular to each other in some embodiments.

Referring to FIGS. 6, 8, and 10, when the second dielectric layers 142 are etched away, the cavities 143 are formed in regions of the memory fingers 112 between the gate line slits 160 and in regions of the memory fingers 113 between the gate line slits 161. If the dummy channel holes 162 and 163 are not configured (e.g., if the dummy channel holes 162 and 163 are removed in FIG. 6), adjacent cavities 143 that are in the adjacent memory fingers and separated by the gate line slit 160 or 161 may be connected by a portion of the cavity 143 around the end of the gate line slit 160 or 161. Then, adjacent cavities 143 separated by the gate line slit 160 or 161 may merger together at a place where the dummy channel hole 162 or 163 is located. Because the dummy channel holes 162 and 163 are configured, cavities 143 in the adjacent memory fingers do not merge together. Similarly, the dummy channel hole may also be configured to prevent cavities 143 of adjacent memory blocks (not shown) from merging together.

Take the gate line slit 160 for example. When the second dielectric layers 142 between two adjacent gate line slits 160 are etched away, small cavities are initially formed next to the gate line slits 160 and then the cavities expand during the etch process. In some embodiments, the minimum length of the dummy channel hole 162 along the X direction may be a half of the distance between two adjacent gate line slits 160 at the Y direction. When the etch time is increased, the minimum length of the dummy channel hole 162 along the X direction may increase accordingly to prevent cavities 143 of two adjacent memory fingers from merging together. Hence, the minimum length of the dummy channel hole 162 along the X direction is related to the configuration of adjacent gate line slits 160 and the etching time.

Referring to FIGS. 6 and 10, in some embodiments, the minimum width of the isolation region 104 along the X direction may be a given value plus a half of the distance between adjacent gate line slits 160 at the Y direction. The given value may be arranged to maintain a minimum separation between the cavities 143 of the planes 2 and 3. When the etch time is increased, the minimum width of the isolation region 104 along the X direction may increase accordingly to maintain the minimum separation between the cavities 143.

Thereafter, an electrically conductive material such as tungsten (W) may be grown to fill the cavities 143 left by the removal of the second dielectric layers 142, forming conductor layers 144 between the first dielectric layers 141. In this manner, the conductor layers 144 fill the cavities 143 of some portions of the layer stack 145, while some other portions of the layer stack 145 remain unchanged, e.g., still having the alternated first and second dielectric layers 141 and 142.

Figure 11:
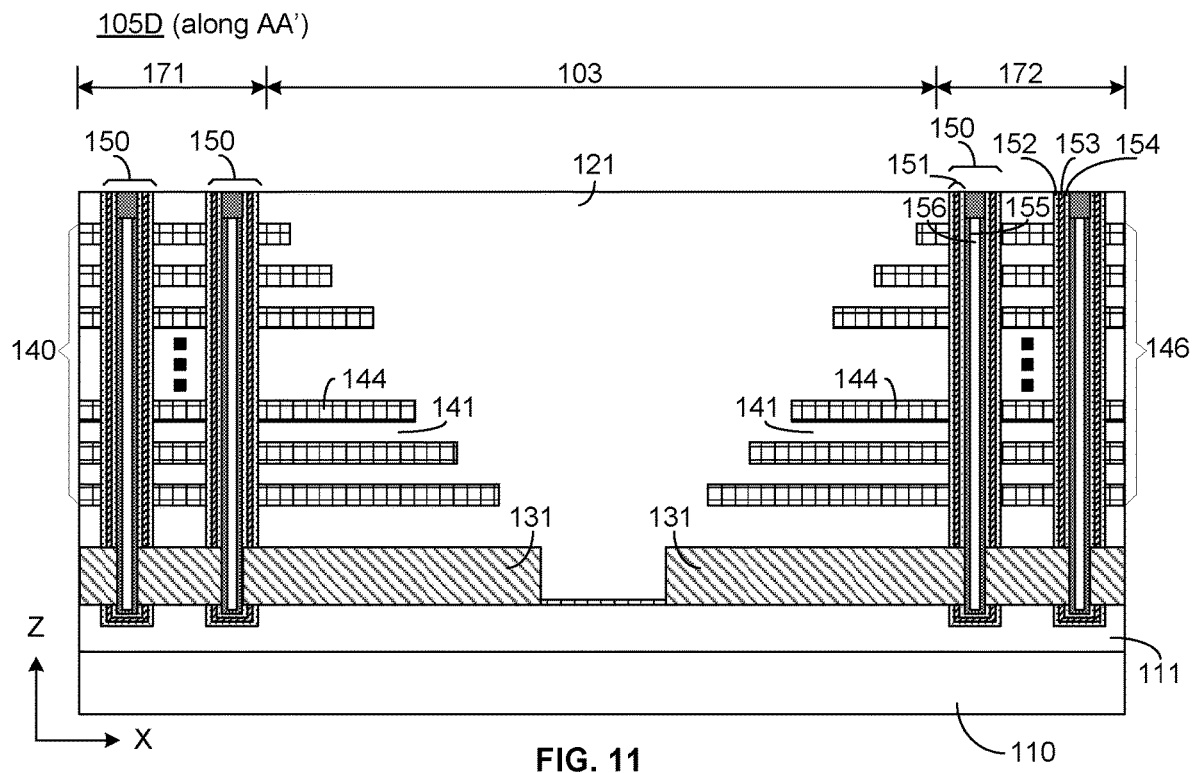
FIGS. 11, 12, and 13 illustrate cross-sectional views of exemplary portions of the 3D memory device shown in FIGS. 8-10 after certain fabrication steps according to various embodiments of the present disclosure.
Figure 12:
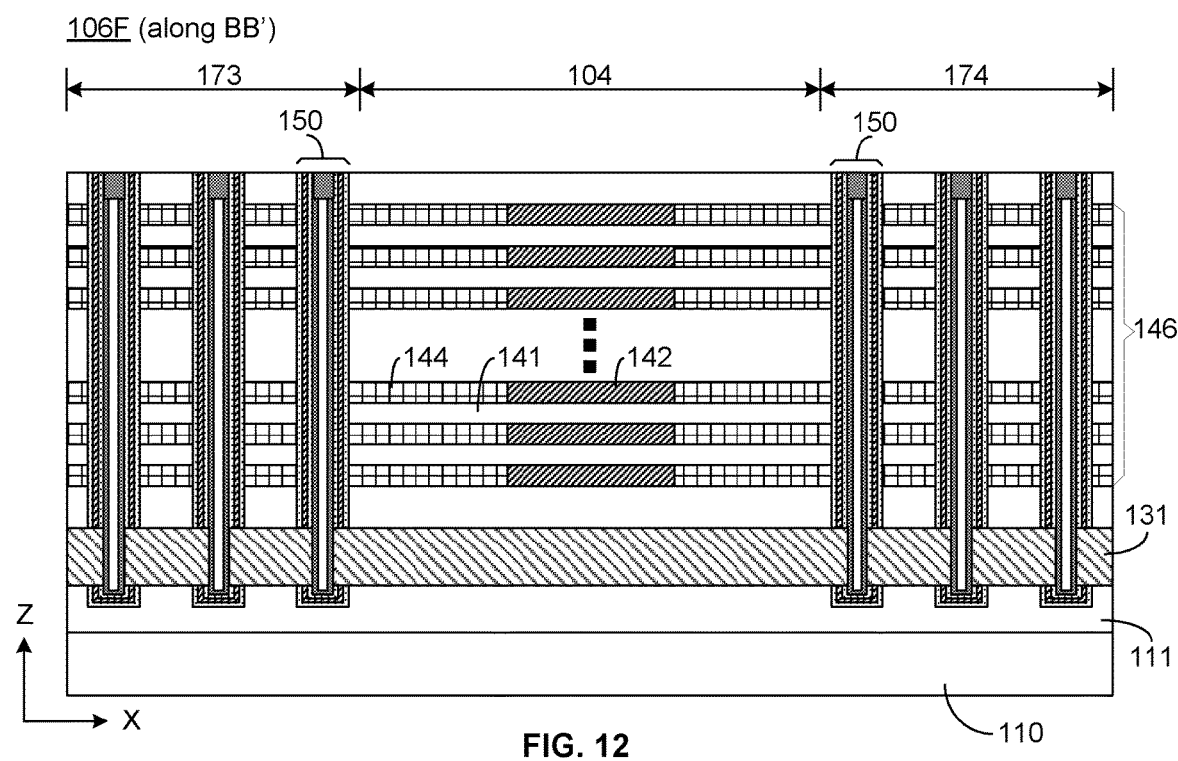
Figure 13:
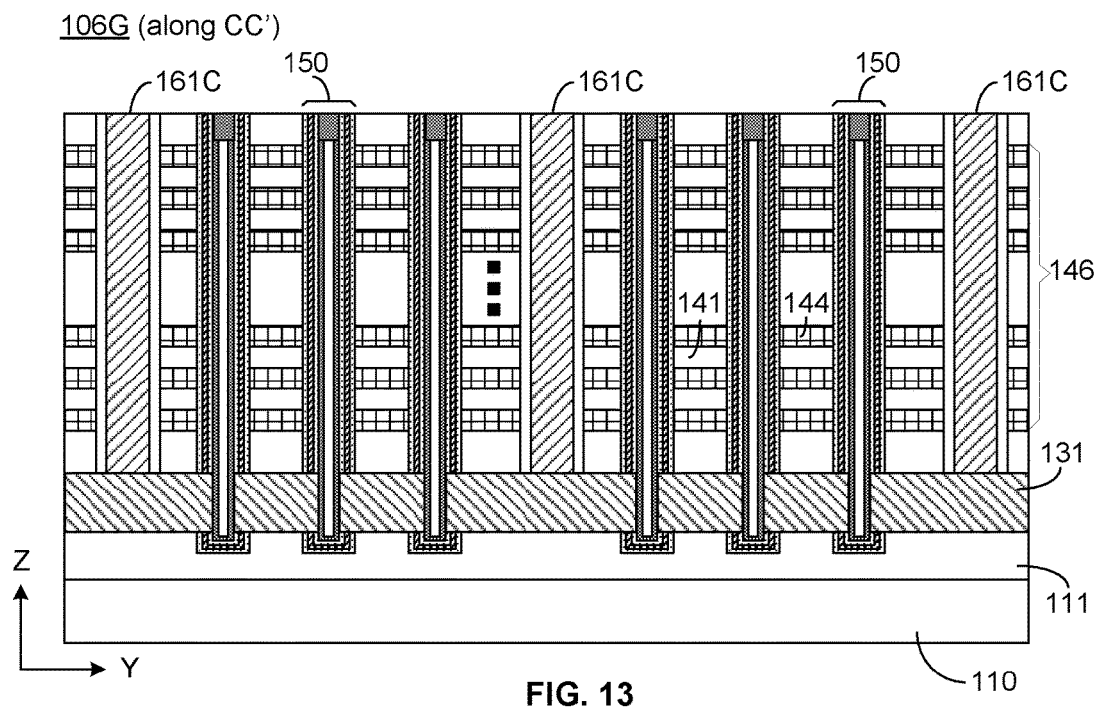

FIGS. 11, 12, and 13 show schematic cross-sectional views in X-Z and Y-Z planes of structures (i.e., structures 105D, 106F, and 106G) of the 3D memory device 100 after the conductor layers 144 are formed according to embodiments of the present disclosure. The cross-sectional views shown in FIGS. 11-13 are taken along the lines AA', BB', and CC', respectively. The line AA' refers to FIG. 1A and the lines BB' and CC' refer to FIGS. 1A and 6.

After the conductor layers 144 are fabricated, the layer stack 145 is converted to a layer stack 146. The layer stack 146 includes the first dielectric layers 141 and the conductor layers 144 that are alternatingly stacked over each other. In some embodiments, before metal W is deposited in the cavities 143, a dielectric layer (not shown) of a high-k dielectric material such as aluminum oxide may be deposited, followed by deposition of a layer of an electrically conductive material such as titanium nitride (TiN) (not shown). Then metal W may be deposited to form the conductor layers 144. CVD, PVD, ALD, or a combination of two or more of these processes may be used in the deposition processes. In some other embodiments, another conductive material, such as cobalt (Co), copper (Cu), aluminum (Al), titanium (Ti), tantalum (Ta), tantalum nitride (TaN), doped silicon, or any combination thereof, may be used to form the conductor layers 144.

As shown in FIG. 12, the conductor layers 144 of the regions 173 and 174 are separated by the layered isolation structure in the middle of the isolation region 104. The layered isolation structure is proximate to and between the adjacent planes 2 and 3 in the X direction. The first dielectric layers 141 from the layer stack 146 and the layered isolation structure contain the same material. In addition, corresponding first dielectric layers 141 of the layer stack 146 and the layered isolation layer are formed at the same time. Compared to a dummy staircase region, the isolation region 104 may occupy a smaller die area. For example, a dummy staircase region may include two dummy staircase structures plus a dielectric layer. The separation between the two dummy staircase structures alone may be similar to the width of the isolation region 104 along the X direction. In addition, unlike the layered isolation structure, a dummy staircase structure gets bigger when the layer stack 146 has more pairs of stack layers. Thus, the effective die area and memory density of the 3D memory device 100 may be improved.

Referring again to FIG. 11, 12, or 13, a portion of each functional layer 151 in a channel hole 150 is between a portion of one of the conductor layers 144 and a portion of a channel layer 155 in the channel hole 150. Each conductor layer 144 is configured to electrically connect rows of NAND memory cells in an X-Y plane and is configured as a word line for the 3D memory device 100. The channel layer 155 formed in the channel hole 150 is configured to electrically connect a column or a string of NAND memory cells along the Z direction and configured as a bit line for the 3D memory device 100. As such, a portion of the functional layer 151 in the channel hole 150 in the X-Y plane, as a part of a NAND memory cell, is arranged between a conductor layer 144 and a channel layer 155, i.e., between a word line and a bit line. A portion of the conductor layer 144 that is around a portion of the channel hole 150 functions as a control gate or gate electrode for a NAND memory cell. The 3D memory device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells.

After the conductor layers 144 are grown in the cavities 143, an electrical insulation layer (e.g., a silicon oxide layer) may be deposited on the sidewalls and bottom surfaces of the gate line slits 160 and 161 by CVD, PVD, ALD, or a combination of two or more of these processes. Then, a dry etch process or a combination of dry etch and wet etch processes may be performed to remove the insulation layer at the bottom of the gate line slits to expose parts of the semiconductor layer 131. Then the gate line slits may be filled with a conductive material (e.g., doped polysilicon). The conductive material in the gate line slit may become an electrically conductive channel, extending through the layer stack 146 and electrically contacting the semiconductor layer 131. In some embodiments, the filled gate line slits become an array common source, such as an array common source 161C as shown in FIG. 13. In some embodiments, filling the gate line slits may include depositing an insulation layer, a conductive layer (such as TiN, W, Co, Cu, or Al), and then a conductive material such as doped polysilicon. In some other embodiments, some gate line slits may be filled with a dielectric material. In these cases, some other gate line slits may be filled with a conductive material to work as an array common source.

Figure 14:
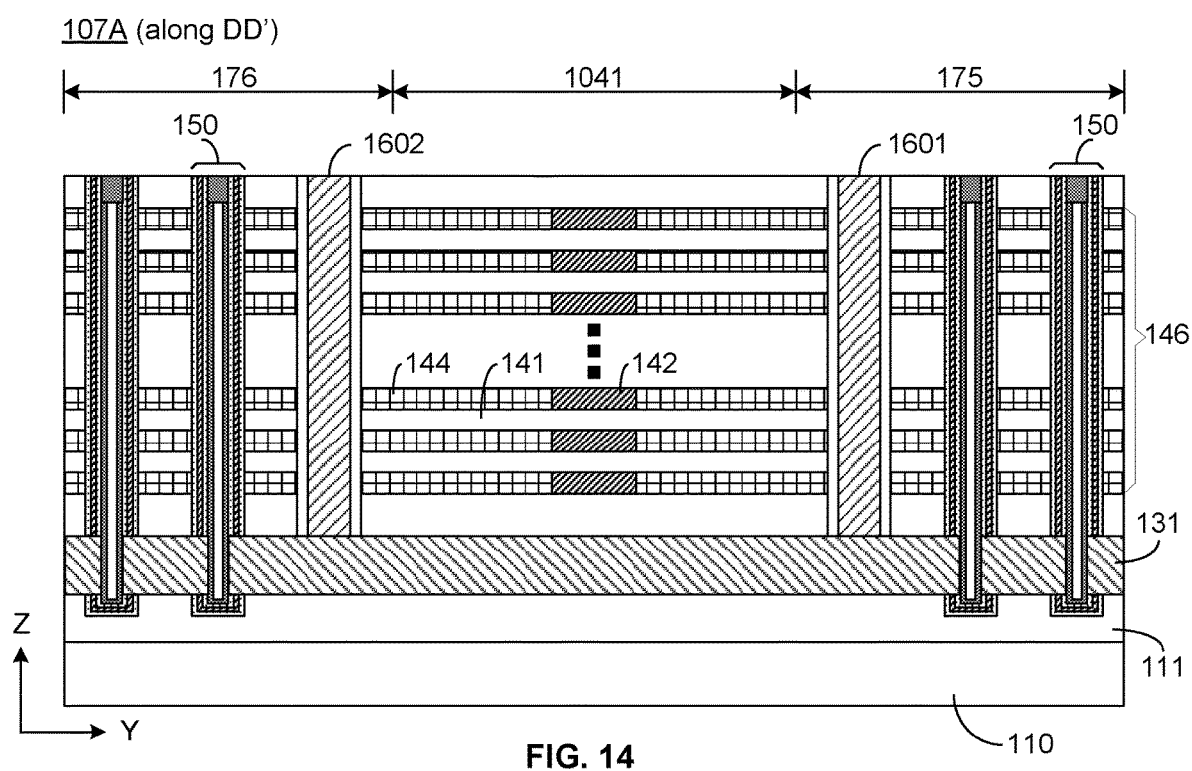
FIGS. 14 and 15 illustrate cross-sectional views of two exemplary portions of the 3D memory device shown in FIGS. 8-10 after certain fabrication steps according to various embodiments of the present disclosure.
Figure 15:
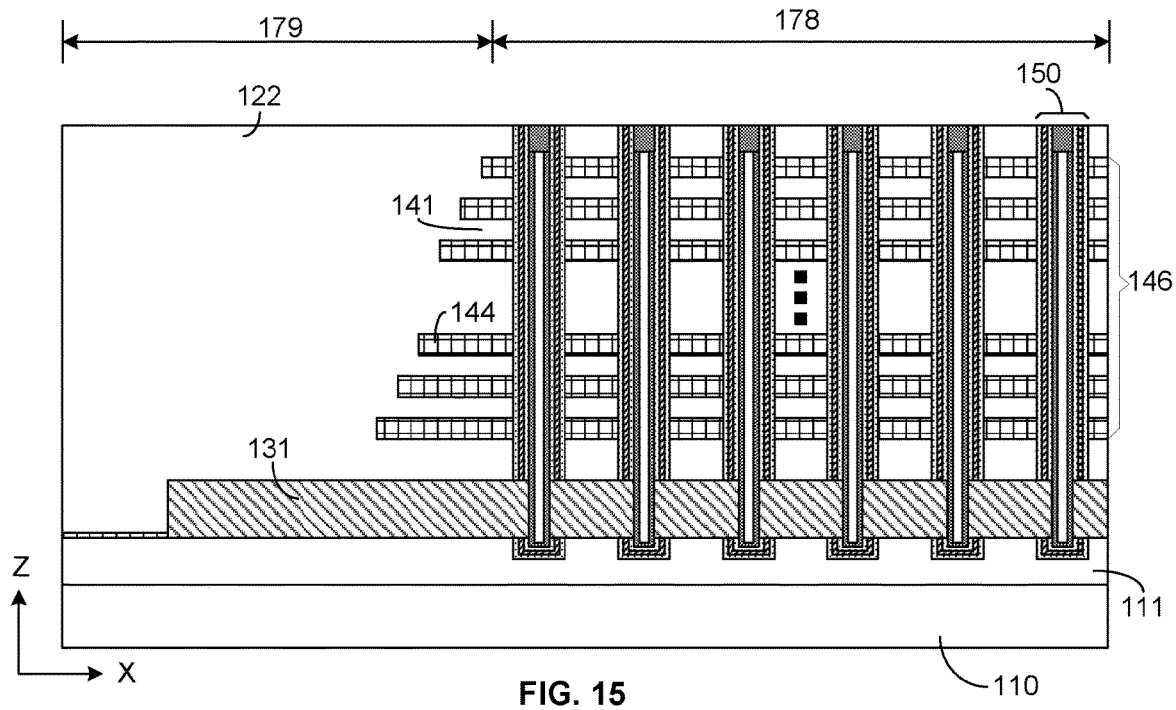

FIGS. 14 and 15 show schematic cross-sectional views in Y-Z and X-Z planes of structures (i.e., structures 107A and 108A) of the 3D memory device 100 after the conductor layers 144 are formed according to embodiments of the present disclosure. The cross-sectional views shown in FIGS. 14 and 15 are taken along the lines DD' and EE' of FIG. 1A, respectively. As such, structures 107A and 108A correspond to regions 107 and 108 of FIG. 1A, respectively. Referring to FIGS. 14 and 1A, the structure 107A may include channel hole regions 175 and 176 and the isolation region 1041. The channel hole regions 175 and 176 are parts of channel hole regions of the memory planes 1 and 5, respectively. Array common sources 1601 and 1602 are formed in the gate line slits. The array common sources 1601 and 1602 and the gate line slits are adjacent to the isolation region 1041 and parallel to the X direction, i.e., the first lateral direction. The isolation region 1041 isolates the planes 1 and 5 in the Y direction and may have a similar structure to that of the isolation region 104 of FIG. 12.

For example, the isolation region 1041 may have portions of the second dielectric layers 142 that are not etched away when the cavities 143 are formed. The remaining portions of the second dielectric layers 142 and some portions of the first dielectric layers 141 form a layered isolation structure. The first dielectric layers 141 from the layer stack 146 and the layered isolation structure contain the same material. Additionally, corresponding first dielectric layers 141 of the layer stack 146 and the layered isolation layer are formed at the same time. As shown in FIGS. 1A and 14, a portion of the layered isolation structure may be proximate to and between the adjacent planes 1 and 5 in the Y direction. In the X-Y plane, the layered isolation structure may extend between the planes 1 and 5 along the X direction. Thus, the direction along which the layered isolation structure extends between the planes 1 and 5 and the first lateral direction are parallel or approximately parallel to each other in the X-Y plane. The planes 1 and 5 may be isolated by the layered isolation structure formed between them.

The structure 108A (or the region 108), unlike the structure 107A, corresponds to a die edge of the die 101 that extends along the Y direction. The plane 1 is adjacent to the edge. The structure 108A may include a channel hole region 178 and a boundary region 179. The channel hole region 178 represents a portion of a channel hole region of the plane 1. The boundary region 179 is arranged between the edge of the die 101 and the plane 1 to isolate the channel hole region 178 from the outside. In some embodiments, the boundary region 179 may include a staircase structure that may be made in a staircase formation process when the staircase structure of the region 103 is fabricated. As the staircase structure of the boundary region 179 is a dummy structure, it may be made steeper than that of the region 103. Additionally, similar to the staircase region 103, the boundary region 179 may include a dielectric layer 122 that covers the dummy staircase structure and provide the isolation function.

Figure 16:
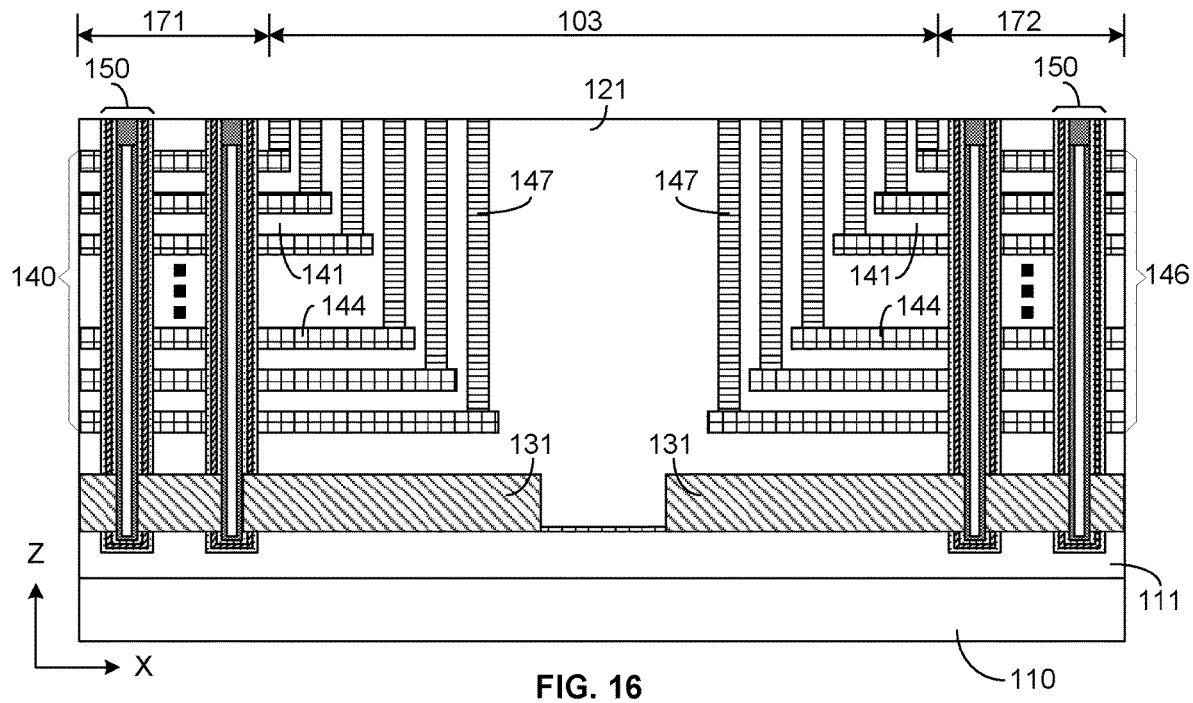
FIG. 16 illustrates a cross-sectional view of an exemplary portion of the 3D memory device shown in FIG. 11 after certain fabrication steps according to various embodiments of the present disclosure.

FIG. 16 shows a schematic cross-sectional view of a structure 105E of the 3D memory device 100 after word line contacts 147 are formed according to embodiments of the present disclosure. The cross-sectional view shown in FIG. 16 is in an X-Z plane and taken along the line AA' of FIG. 1A.

After the gate line slits 160 and 161 are filled, openings for the word line contacts 147 may be formed by, e.g., a dry etch process or a combination of dry and wet etch processes. The openings for the word line contacts 147 are then filled with a conductive material by CVD, PVD, ALD, electroplating, electroless plating, or any combination thereof. The conductive material that forms the word line contacts 147 may include W, Co, Cu, Al, or a combination of two or more of these materials. In some embodiments, a layer of a conductive material (e.g., TiN) may be deposited as a contact layer before another conductive material is deposited when the word line contacts 147 are fabricated.

Thereafter, other fabrication steps or processes are performed to complete fabrication of the 3D memory device 100. Details of the other fabrication steps or processes are omitted for simplicity.

As shown in FIGS. 12 and 14-16, a memory plane may be isolated by a staircase region such as the staircase region 103 or 179, or by an isolation region such as the isolation region 104 or 1041. In the staircase regions 103 and 179, as illustrated in FIGS. 16 and 15, the dielectric layer 121 and 122 provide the isolation function. For example, as shown in FIG. 16, the staircase structure on the left or the right extends from the layer stack 140 to a part of the region 103, and a portion of the dielectric layer 121 on a side of the staircase structure and in the part of the region 103 provides isolation. In the isolation regions 104 and 1041, as illustrated in FIGS. 12 and 14, portions of the first dielectric layers 141 and portions of the second dielectric layers 142 that are not etched away provide the isolation function. That is, alternating dielectric layers (e.g., the alternating first and second dielectric layers 141 and 142) form a layered isolation structure in the isolation region 104 or 1041. Take the isolation region 104 for example. In the Z direction, the layered isolation structure may extend through the layer stack 146. In the X direction, the layered isolation structure may extend at least over a given distance in the middle of the isolation region 104. Furthermore, because dummy channel holes are formed that join the gate line slits and extend in the X direction (e.g., the dummy channel holes 162 and 163 of FIG. 6), when the second dielectric layers 142 are partially etched, the cavities 143 of adjacent memory fingers do not merge. Thus, the conductor layers 144 of adjacent memory fingers do not contact each other, i.e., the conductor layers 144 of adjacent memory fingers are isolated from each other. Similarly, the conductor layers 144 of adjacent memory blocks (not shown) may be isolated from each other using the gate line slits and the dummy channel holes.

Further, as the conductor layers 144 are formed in cavities left by etching away portions of the second dielectric layers 142, a conductor layer 144 of the layer stack 146 and a corresponding second dielectric layer 142 of the layered isolation structure are on the same level with respect to the substrate 110. Since the first dielectric layers 141 remain unchanged in the etch process, a first dielectric layer 141 of the layer stack 146 and a corresponding first dielectric layer 141 of the layered isolation structure are on the same level with respect to the substrate 110.

As a staircase region (e.g., the staircase region 103 or 179) takes a larger area than the isolation region 104 or 1041 in the X-Y plane, a 3D memory device that uses fewer staircase regions for isolation may have a larger effective area and higher memory density. In addition, for an isolation region, such as the isolation region 104 or 1041, a portion of the layer stack 146 containing alternating layers of dielectric materials (e.g., the first and second dielectric layers 141 and 142) is used for isolation. Hence, unlike a staircase structure where a part of a layer stack is trimmed into a staircase and an etched portion has to be filled by a dielectric material, the isolation regions 104 and 1041 may induce less stress on the memory planes 102.

In a conventional 3D memory device, memory planes are separated by staircase regions and dummy staircase regions. For example, for the planes 1-8 as shown in FIG. 1A, four staircase and dummy staircase regions may be arranged to separate the planes in a conventional way. The 3D memory device 100, however, uses two staircase regions and two isolation regions to separate the planes. Hence, fewer staircase regions are used, the effective area may be increased, and less stress may be induced among the planes.

Figure 17:
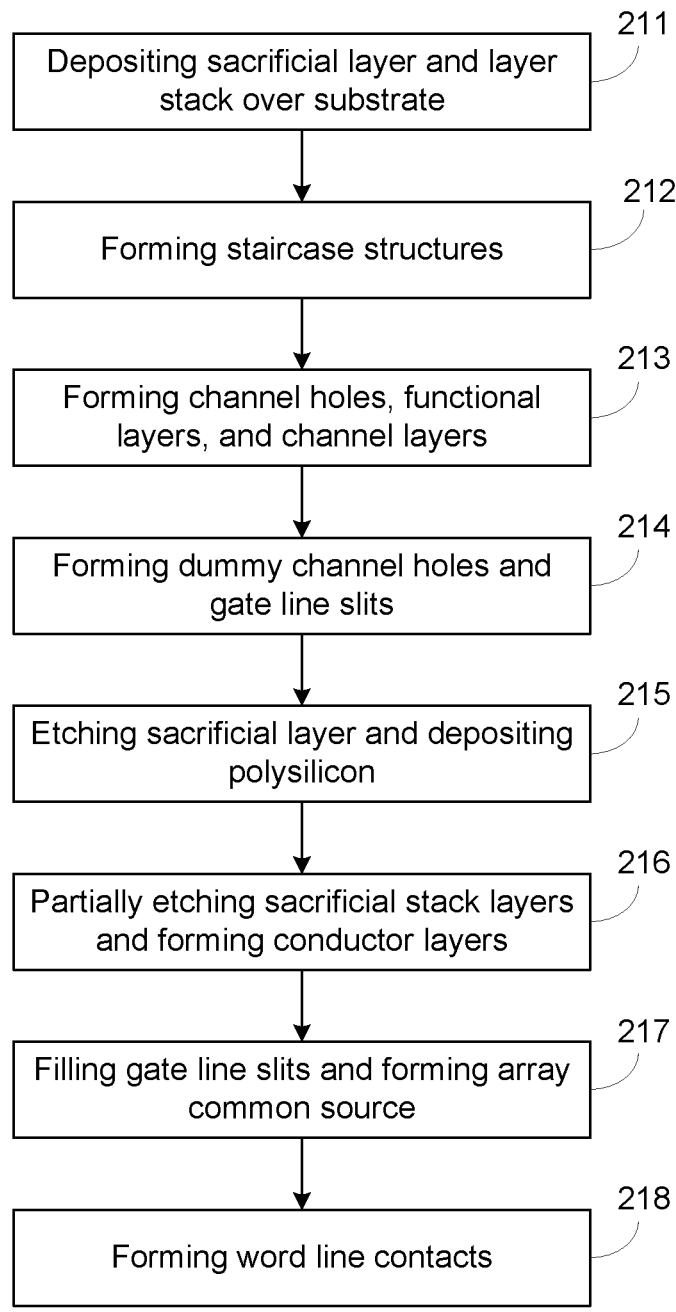
FIG. 17 illustrates a schematic flow chart of fabrication of a 3D memory device according to various embodiments of the present disclosure.

FIG. 17 shows a schematic flow chart 200 for fabricating a 3D memory device according to embodiments of the present disclosure. The 3D memory device includes a memory die that has a substrate. At 211, a sacrificial layer may be deposited over a top surface of the substrate. The substrate may include a semiconductor substrate, such as a single crystalline silicon substrate. In some embodiments, a cover layer may be grown on the substrate before depositing the sacrificial layer. The cover layer may include a single layer or multiple layers that are grown sequentially over the substrate. In some embodiments, the cover layer may include silicon oxide, silicon nitride, and/or aluminum oxide. In some other embodiments, the sacrificial layer may be deposited without first depositing the cover layer over the substrate. The sacrificial layer may include single crystalline silicon, polysilicon, silicon oxide, or silicon nitride.

Over the sacrificial layer, a layer stack of the 3D memory device may be deposited. The layer stack includes a first stack layer and a second stack layer that are alternately stacked. In some embodiments, the first stack layer may include a first dielectric layer and the second stack layer may include a second dielectric layer that is different than the first dielectric layer. In some embodiments, one of the first and second dielectric layers is used as a sacrificial stack layer.

At 212, a staircase formation process may be performed to convert some portions of the layer stack into a staircase region. The staircase formation process may include multiple etches that are used to trim parts of the layer stack into staircase structures in the staircase region. The staircase region is configured to separate two adjacent memory planes.

At 213, channel holes may be formed that extend through the layer stack and the sacrificial layer to expose portions of the substrate. A functional layer and a channel layer may be deposited on the sidewall and bottom surface of each channel hole. Forming the functional layer may include depositing a blocking layer on the sidewall of the channel hole, depositing a charge trap layer on the blocking layer, and depositing a tunnel insulation layer on the charge trap layer. The channel layer, deposited on the tunnel insulation layer, functions as a semiconductor channel and may include a polysilicon layer.

At 214, dummy channel holes and gate line slits of the 3D memory device may be formed, respectively. Along the vertical direction, the dummy channel holes and gate line slits may extend through the layer stack. The gate line slits divide the channel holes of a memory plane into memory blocks and divide the channel holes of a memory block into memory fingers. Each dummy channel hole joins an end of a gate line slit and extends from the end of the gate line slit along the same horizontal direction. After the gate line slits are created, portions of the sacrificial layer are exposed.

At 215, the sacrificial layer may be etched away, and a cavity may be created above the substrate. The cavity exposes a bottom portion of the blocking layer of the functional layer in the cavity. The cover layer is also exposed in the cavity, if it is deposited on the substrate. Then, the layers of the functional layer exposed sequentially in the cavity, including the blocking layer, the charge trap layer, and the tunnel insulation layer, are etched away by, e.g., one or more selective etch processes, respectively. As a result, a portion of the functional layer that is close to the substrate may be removed in the cavity. The cover layer, if deposited, also may be etched away during the process to etch the portion of the functional layer or in another selective etch process. Hence, a portion of the substrate and portions of the channel layers are exposed in the cavity.

Thereafter, a deposition process may be performed to grow a semiconductor layer such as a polysilicon layer in the cavity. The polysilicon layer electrically contacts the channel layers and the substrate.

In some embodiments, the layer stack includes two dielectric stack layers and one of the stack layers is sacrificial. The sacrificial stack layers may be partially etched away at 216 to leave cavities, which then may be filled with an electrically conductive material to form the conductor layers. The electrically conductive material may include a metal such as W, Co, Cu, Al, Ti, or Ta. Because the sacrificial stack layers are partially etched, certain portions of the sacrificial stack layers remain after the etch process. The remaining sacrificial stack layers and the other dielectric stack layers are alternately stacked, which may form a layered isolation structure between two adjacent memory planes. The layered isolation structure electrically isolates the adjacent memory planes.

At 217, a dielectric layer such as an oxide layer may be deposited on the side walls and bottom surfaces of the gate line slits. Portions of the dielectric layer on the bottom surfaces may be etched out selectively to expose the polysilicon layer. Electrically conductive materials, such as TiN, W, Cu, Al, and/or doped polysilicon may be deposited in the gate line slits to form an array common source that electrically contacts the polysilicon layer.

At 218, etching may be performed to form openings for the word line contacts in the staircase region. The openings may be filled with a conductive material (e.g., W, Co, Cu, Al) to form the word line contacts. Thereafter, additional fabrication steps or processes may be performed to complete fabrication of the 3D memory device.

Figure 18:
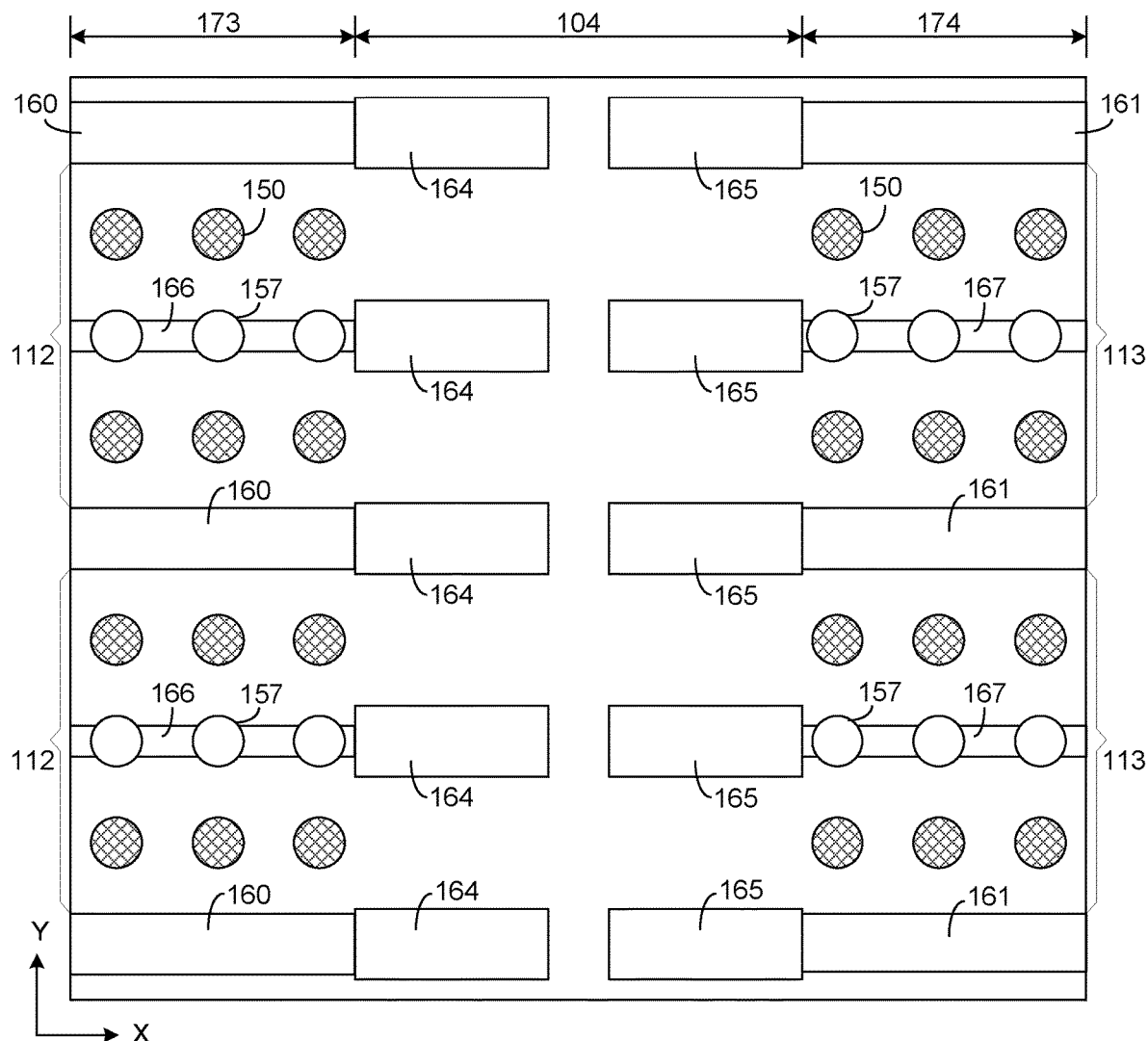
FIG. 18 illustrates a top view of an exemplary portion of the 3D memory device shown in FIGS. 4 and 5 after certain fabrication steps according to various embodiments of the present disclosure.

FIG. 18 shows a schematic top view in an X-Y plane of a structure (i.e., a structure 106H) of the 3D memory device 100 after dummy channel holes 164 and 165 and gate line slits 160 and 161 are formed according to embodiments of the present disclosure. FIG. 18 is an enlarged view of the region 106 of FIG. 1A at a certain stage. The structure 106H of FIG. 18 is similar to the structure 106B of FIG. 6 but the configuration of the dummy channel holes 164 and 165, dummy channel holes 157, and top select gate (TSG) cuts 166 and 167. The dummy channel holes 157 may provide mechanical support during a fabrication process. In some embodiments, a row of dummy channel holes 157 may be configured in the middle of the memory fingers 112 or 113. For example, when nine rows of channel holes are configured between two adjacent gate line slits, the middle row (i.e., the fifth row) may be used to form the dummy channel holes. The dummy channel hole 157 may be an insulating structure containing one or more dielectric materials. In some embodiments, the dummy channel hole 157 may have a similar shape and similar dimensions to that of the dummy hole 150. In some embodiments, the dummy channel hole 157 may have the same shape and same dimensions as that of the dummy hole 150.

In some embodiments, a TSG cut (e.g., the TSG cut 166 or 167) may be formed that runs through a row of dummy channel holes 157 and extends along the first lateral direction to divide a memory finger into two portions. The TSG cut 166 or 167 may have a narrower width than that of the gate line slit 160 or 161 in the Y direction and extend continuously between the gate line slits. In the vertical direction (i.e., the Z direction), the TSG cut 166 or 167 may extend within a limited range and only partially through the layer stack 146. In some embodiments, the dummy channel holes 164 and 165 may have a similar shape and similar dimensions to that of the dummy channel holes 162 and 163. In some embodiments, the dummy channel holes 164 and 165 may have the same shape and same dimensions as that of the dummy channel holes 162 and 163.

Similar to the dummy channel holes 162 and 163, some dummy channel holes 164 and 165 may adjoin a gate line slit and extend toward the middle of the isolation region 104 along the first lateral direction. Similarly, some other dummy channel holes 164 and 165 may adjoin a TSG cut and extend toward the middle of the isolation region 104 along the first lateral direction. Besides the dummy channel hole 157, the dummy channel holes 162-165 may also provide mechanical support during the fabrication process.

Figure 19:
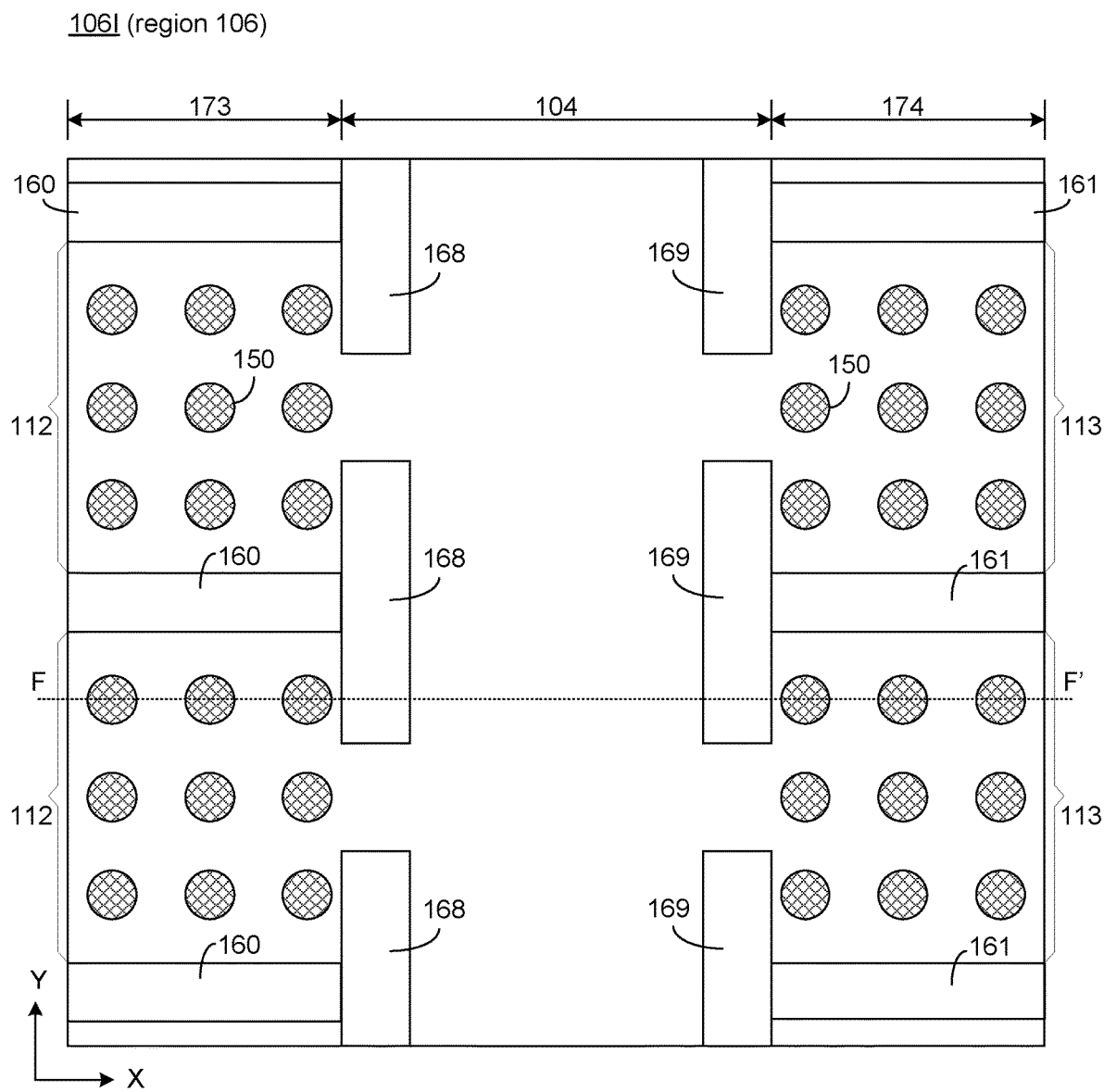
FIGS. 19 and 20 illustrate a top view and a cross-sectional view of an exemplary portion of the 3D memory device shown in FIGS. 4 and 5 after certain fabrication steps according to various embodiments of the present disclosure.
Figures 1, 19:
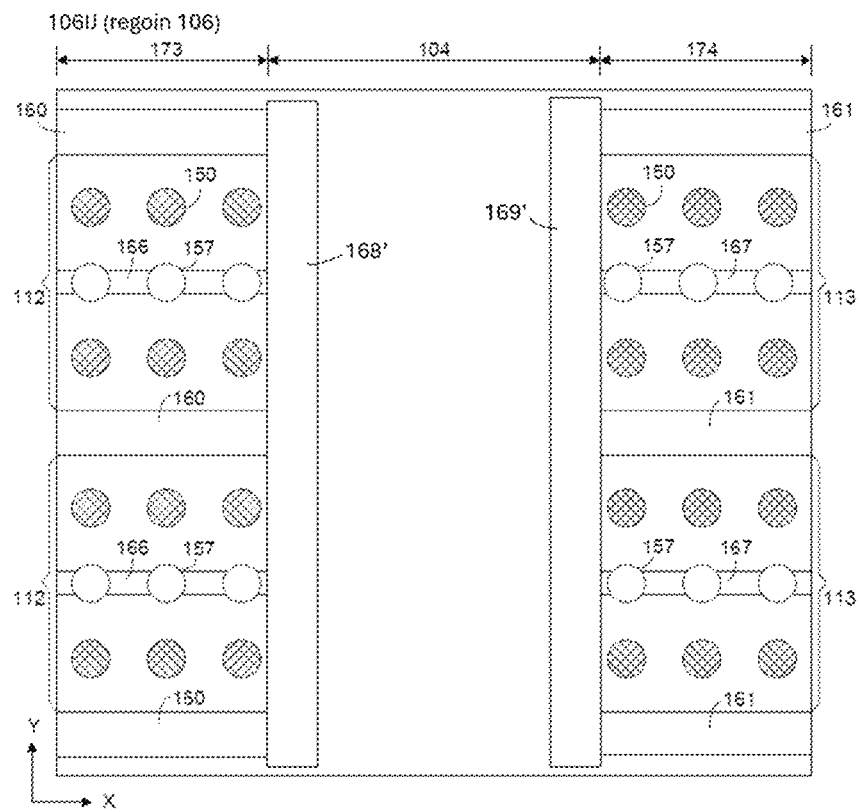
Figure 20:
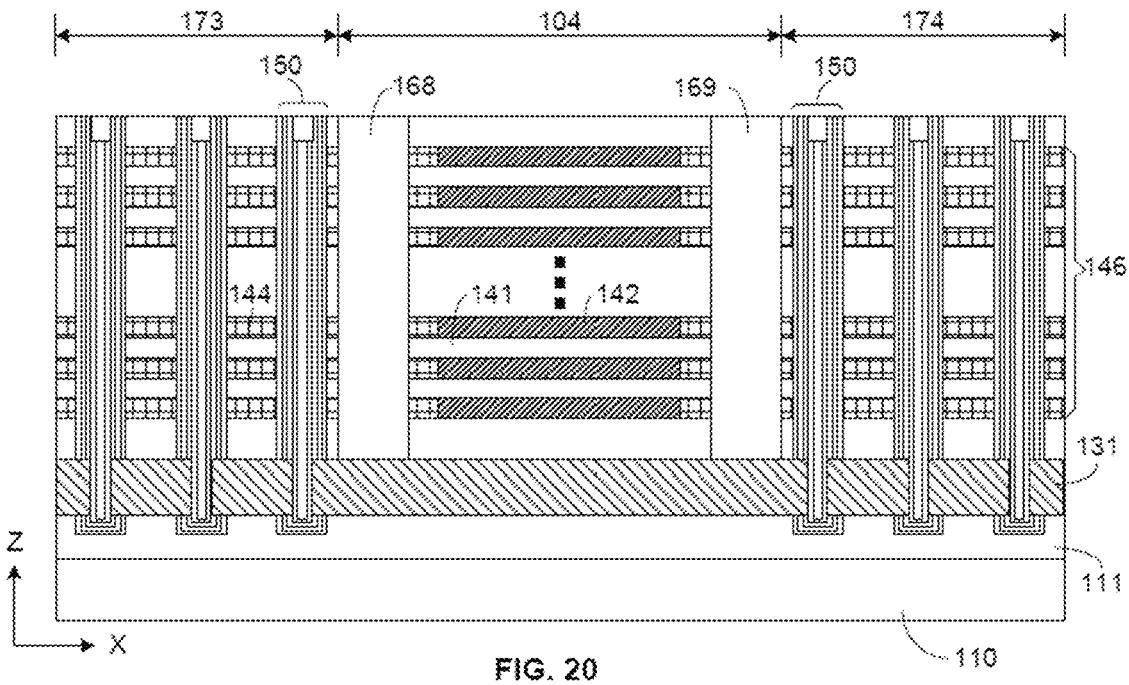

In some embodiments, dummy channel holes different than dummy channel holes 162 and 163 of FIG. 6 are formed, as illustrated in FIGS. 19 and 20. FIGS. 19 and 20 show a top view in an X-Y plane and a cross-sectional view in an X-Z plane of structures (i.e., structures 106I and 106J) of the 3D memory device 100 after dummy channel holes 168 and 169 and the gate line slits 160 and 161 are formed according to embodiments of the present disclosure. FIG. 19 is an enlarged view of the region 106 of FIG. 1A at a certain stage. The cross-sectional view in FIG. 20 is taken along a line FF' of FIG. 19. The dummy channel holes 168 and 169 are insulating structures formed by one or more dielectric materials. Along the vertical direction, the dummy channel holes 168 and 169 may extend through the layer stack 146. Each dummy channel hole 168 or 169 may join an end of a gate line slit and extend from the end of the gate line slit. Take the dummy channel hole 168 for example. The dummy channel hole 168 may join the gate line slit 160 at an end of the gate line slit 160 but unlike the dummy channel holes 162-165, the dummy channel hole 168 does not extend along the first lateral direction (i.e., the X direction). Instead, the dummy channel hole 168 may extend along one or two directions that are different from the X direction or not parallel to the first lateral direction. For example, as shown in FIG. 19, the dummy channel hole 168 may extend from an end of the gate line slit 160 along two directions of the Y axis. In some other embodiments, the dummy channel hole 168 may extend away from the gate line slit 160 along a direction between the X and Y axes. In some embodiments, the dummy channel hole 168 may have a regular shape such as a rectangle in the X-Y plane. In some embodiments, the dummy channel hole 168 may have an irregular shape in the X-Y plane.

As the main purpose of the dummy channel hole 168 is to electrically isolate two adjacent memory fingers 112, the configuration of the dummy channel hole 168 may be any that may achieve the isolation objective. When the dummy channel hole 168 extends in a direction perpendicular to the first lateral direction, i.e., extending along the Y direction, the minimum length of the dummy channel hole 168 along the Y direction in a memory finger region may be a quarter of the distance between two adjacent gate line slits 160. When the etching time is increased, the minimum length of the dummy channel hole 168 may increase. Hence, similar to the dummy channel hole 162, the minimum length of the dummy channel hole 168 is related to the configuration of adjacent gate line slits 160 and the etching time.

When the second dielectric layer 142 is etched, the second dielectric layer 142 that is between the gate line slits 160 or in the channel hole region 173 may be etched out completely. At the same time, the second dielectric layer 142 that is in the isolation region 104 may be etched partially. As shown in FIG. 20, a portion of the second dielectric layer 142 may remain in the isolation region 104. As such, a layered isolation structure may be formed between the adjacent planes 2 and 3. The layered isolation structure contains alternating first and second dielectric layers 141 and 142 and extends along the Y direction to separate the planes 2 and 3.

In some embodiments, the dummy channel holes 168 may adjoin the gate line slits 160, separately, as shown in FIG. 19. In some embodiments, the dummy channel holes 168 that adjoin the gate line slits 160 may be connected to form a single dummy channel hole in a memory finger or memory block. FIG. 19-1 is an enlarged top perspective view of region 106 in FIG. 1A, shown at a certain processing stage. For example, a single dummy channel hole 168' (or 169')

may extend from an end of a first gate line to an end of a second gate line slit and then to an end of a third gate lined slit, and so on. That is, a single dummy channel hole 168' (or 169') may intersect multiple gate line slits 160 (or 161) as it extends along or roughly along the Y direction, as shown in FIG. 19-1. When some TSG cuts 166 (or 167) are configured, the single dummy channel hole 168' (or 169') may intersect multiple gate line slits 160 (or 161) and multiple TSG cuts 166 (or 167) as it extends along or roughly along the Y direction, as show in FIG. 19-1. As such, the single dummy channel hole may "seal" one side of the memory finger 112 completely or "seal" ends of multiple memory fingers 112 on one side completely. In this case, when the second dielectric layers 142 between gate line slits 160 are etched out, the second dielectric layers 142 that are in the isolation region 104 may remain intact and be a part of a layered isolation structure.

Figure 21:
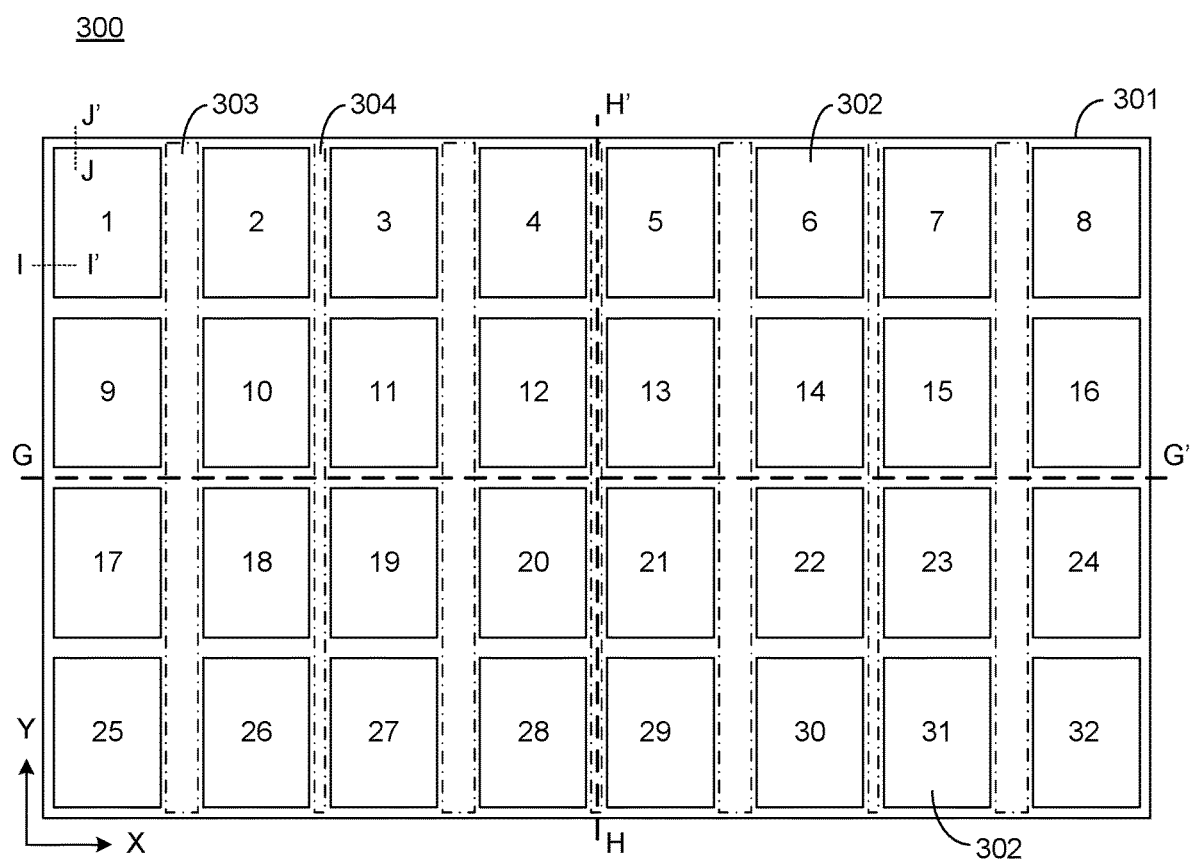
FIG. 21 illustrates a top view of an exemplary 3D memory structure according to various embodiments of the present disclosure.

FIG. 21 shows a schematic top view in an X-Y plane of an exemplary 3D memory structure 300 according to embodiments of the present disclosure. As shown in FIG. 21, the 3D memory structure 300 includes a 3D memory chip 301. The chip 301 may exemplarily include thirty-two memory planes 302, i.e., planes 1-32, and be divided or diced into four dies along lines GG' and HH'. For example, one of the dies may include eight planes 1-4 and 9-12. In a conventional 3D memory device, memory planes are separated by staircase regions such as the staircase region 103 of FIG. 1A. Consequently, in a conventional way, ten staircase regions may be needed to separate the planes 1-32. The 3D memory structure 300, however, may have four staircase regions 303 and six isolation regions to separate the planes 1-32. As shown in FIG. 21, the six isolation regions include three isolation regions 304 that each extend between two adjacent memory planes (e.g., the planes 2 and 3) and extend along the Y direction. The six isolation regions also include three isolation regions (not shown) that each extend between two adjacent memory planes (e.g., the planes 9 and 17) and extend along the X direction. The six isolation regions may have similar shapes with similar isolation structures.

In some embodiments, the staircase region 303 of FIG. 21 may have a similar shape and similar structure to that of the staircase region 103 of FIG. 1A. Similarly, in some embodiments, the isolation region 304 of FIG. 21 may have a similar shape and similar structure to that of the isolation region 104 of FIGS. 1A and 12. In some embodiments, the isolation region that extends between two adjacent memory planes (e.g., the planes 9 and 17) and extends along the X direction in FIG. 21 may have a similar shape and similar structure to that of the isolation region 1041 of FIGS. 1A and 14.

For example, similar to the staircase region 103 of FIGS. 1A and 16, the staircase region 303 may include a dielectric layer (such as the dielectric layer 121 of FIG. 16) between two staircase structures that isolates two adjacent memory planes 302. Similar to the isolation region 104 of FIGS. 1A and 12, the isolation region 304 may include a layered isolation structure that contains alternating dielectric layers to isolate adjacent memory planes 302. In addition, the isolation region 304 may include dummy channel holes. The dummy channel holes may adjoin the gate line slits respectively and extend along one or two directions to prevent short circuit between adjacent memory fingers or memory blocks.

In some embodiments, the edge region of the chip 301 may include a staircase region such as the staircase region 179 of FIG. 15 for isolation. In some embodiments, the edge region of the chip 301 may include a layered isolation structure that contains alternating dielectric layers for isolation to further increase the effective area of the chip 301.

Figure 22:
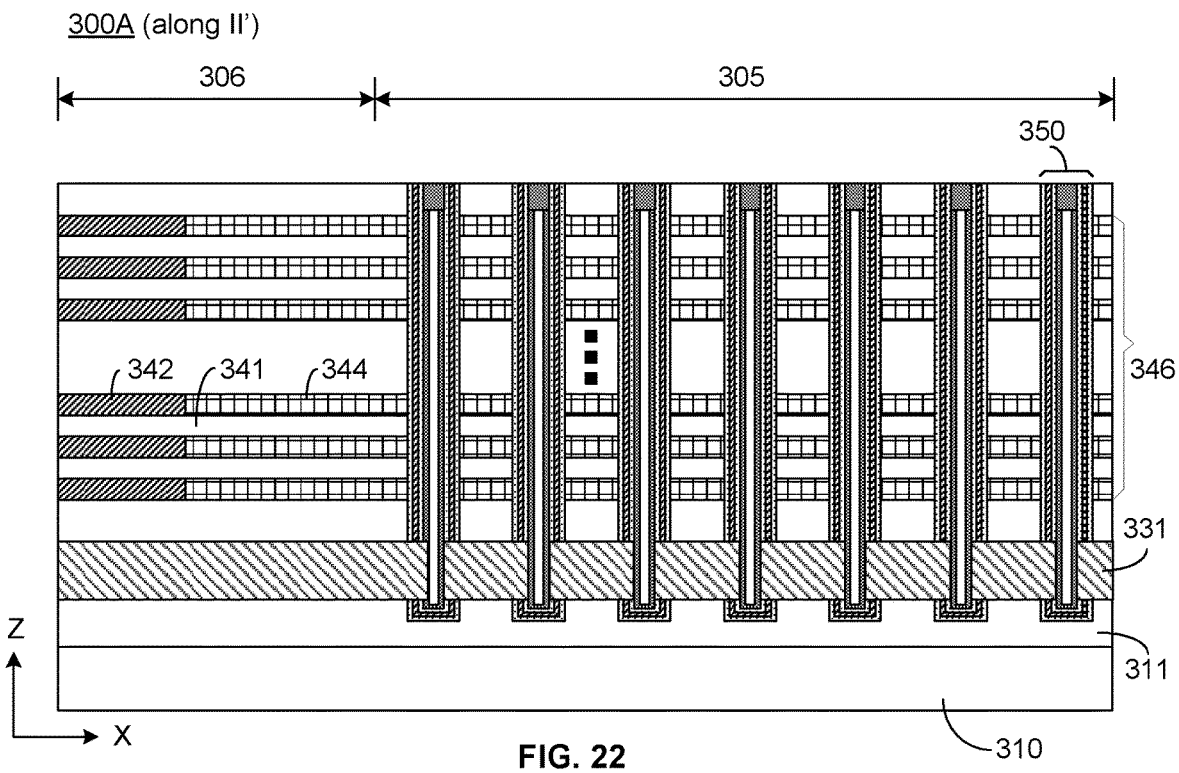
FIGS. 22 and 23 illustrate cross-sectional views of two exemplary portions of the 3D memory structure shown in FIG. 21 according to various embodiments of the present disclosure.
Figure 23:
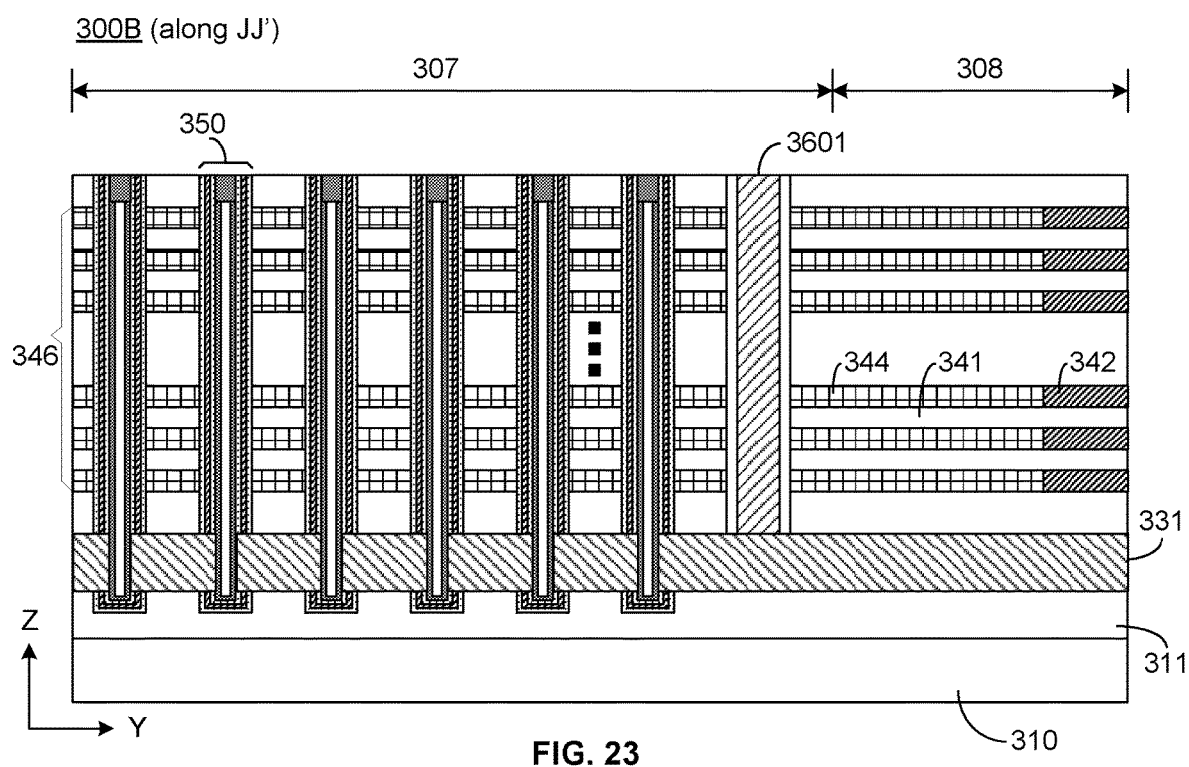

FIGS. 22 and 23 show schematic cross-sectional views in X-Z and Y-Z planes of structures (i.e., structures 300A and 300B) of the 3D memory structure 300 after certain fabrication steps according to embodiments of the present disclosure. The cross-sectional views shown in FIGS. 22 and 23 are taken along lines II' and JJ' of FIG. 21, respectively. The line II' runs across a chip edge that is adjacent to the plane 1 and parallel to the Y axis. The line JJ' runs across a chip edge that is adjacent to the plane 1 and parallel to the X axis. As shown in FIGS. 22 and 23, similar to the 3D memory device 100, the chip 301 may include a substrate 310 (e.g., a single crystalline silicon substrate), a doped region 311, a semiconductor layer 331, and a layer stack 346. The layer stack 346 may include first dielectric layers 341 and conductor layers 344 that are stacked over each other alternately. Channel holes 350 may be formed through the layer stack 346. The channel holes 350 may have a structure similar to that of the channel hole 150 of FIG. 4. Functional layers and channel layers similar to the functional layer 151 and the channel layer 155 of FIG. 4 may be formed in the channel holes 350. The semiconductor layer 331, the layer stack 346, and the channel holes 350 may be formed in a similar way to that described above when the 3D memory device 100 is fabricated.

Referring to FIG. 22, the structure 300A corresponds to a chip edge that is adjacent to the plane 1 and parallel to the Y axis. A channel hole region 305 represents a portion of the layer stack 346 that contains the channel holes 350. An isolation region 306 extends between the chip edge and the plane 1 that is adjacent to the chip edge. In the isolation region 306, a layered isolation structure may be configured that includes the first dielectric layers 341 and second dielectric layers 342 that are alternately stacked over each other. The isolation region 306 may be formed in the same process when the isolation region 304 is fabricated, during which the second dielectric layers 342 may be etched partially and some portions of the second dielectric layers 342 close to the chip edge may remain after the etch process. The remaining portions of the second dielectric layers 342 close to the chip edge and portions of the first dielectric layers 341 form the layered isolation structure in the isolation region 306. The first dielectric layers 341 from the layer stack 346 and the layered isolation structure contain the same material. In addition, corresponding first dielectric layers 341 of the layer stack 346 and the layered isolation layer are formed at the same time. In the vertical direction, the layered isolation structure in the isolation region 306 may extend toward the substrate 310 and reach a region adjacent to the semiconductor layer 331. In the X-Y plane, the layered isolation structure may be formed proximate to and between the chip edge and the plane 1 that is adjacent to the chip edge, and extend along a direction parallel to the chip edge (i.e., parallel to the Y direction). As adjacent gate line slits (not shown) may extend along a first lateral direction (e.g., the X direction), the direction along which the layered isolation structure extends in the isolation region 306 and the first lateral direction may be perpendicular to each other in the X-Y plane.

Referring to FIG. 23, the structure 300B corresponds to a chip edge that is adjacent to the plane 1 and parallel to the X axis. A channel hole region 307 represents a portion of the layer stack 346. The channel hole region 307 may include channel holes 350 and an array common source 3601 that is formed in a gate line slit. The gate line slit extend along the first lateral direction (i.e., the X direction). An isolation region 308 is formed proximate to and between the chip edge and the plane 1 that is adjacent to the chip edge. In the isolation region 308, a layered isolation structure may be arranged that includes the first dielectric layers 341 and the second dielectric layers 342 that are alternately stacked over each other. The isolation region 308 may be formed in the same process when the isolation regions 304 and 306 are fabricated, during which the second dielectric layers 342 are etched partially and some portions of the second dielectric layers 342 close to the chip edge may remain after the etch process. The remaining portions of the second dielectric layers 342 close to the chip edge and portions of the first dielectric layers 341 form the layered isolation structure in the isolation region 308. The first dielectric layers 341 from the layer stack 346 and the layered isolation structure contain the same material. In addition, corresponding first dielectric layers 341 of the layer stack 346 and the layered isolation layer are formed at the same time. In the vertical direction, the layered isolation structure in the isolation region 308 may extend toward the substrate 310 and reach a region adjacent to the semiconductor layer 331. In the X-Y plane, the layered isolation structure may be formed between the chip edge and the plane 1 that is adjacent to the chip edge, and extend along a direction parallel to the chip edge (i.e., parallel to the X direction). Then, the direction along which the layered isolation structure extends in the isolation region 308 and the first lateral direction may be parallel to each other.

The chip 301 may have dicing streets along the lines GG' and HH' and be diced or sawed using the dicing streets. The dicing street may have a layered isolation structure, instead of a dielectric layer between dummy staircase structures. In some embodiments, the dicing street may be arranged to run through a middle region of the layered isolation structure. Thus, the four dies of the chip 301 each may be surrounded by layered isolation structures. As such, less area may be used for isolation in edge regions of the dies, in comparison to edge regions containing dummy staircase structures.

Hence, the 3D memory structure 300 may have fewer staircase regions for isolation between memory planes and in edge regions. As such, the effective area of the chip 301 may be increased and less stress may be induced among memory planes 302.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

The invention claimed is:

1. A three-dimensional (3D) memory device, comprising:
a first core region, a second core region, and an isolation region between the first core region and the second core region along a first direction;
a stack in the first core region and the second core region and comprising alternatingly stacked first dielectric layers and conductor layers;
gate line slit structures extending through the stack along a second direction in the first core region and the second core region, the second direction being perpendicular to the first direction;
top select gate (TSG) cut structures extending through a portion of the stack along the second direction; and
a first isolation structure extending through the stack along the second direction in the isolation region, wherein:
the gate line slit structures and the TSG cut structures extend along the first direction, and one of the TSG cut structures is between two of the gate line slit structures along a third direction perpendicular to the first direction and the second direction;
the first isolation structure contacts ends of at least two of the gate line slit structures and ends of at least two of the TSG cut structures, the ends of the at least two of the gate line slit structures being flush with the ends of the at least two of the TSG cut structures to configure the first isolation structure to extend substantially along the third direction; and
the first isolation structure extends, along the second direction, through the stack comprising alternatingly stacked first dielectric layers and conductor layers.

2. The 3D memory device according to claim 1, wherein:
the first isolation structure extends along the third direction and contacts with the at least two of the gate line slit structures and the at least two of the TSG cut structures, the at least two of the TSG cut structures being disposed between the at least two of the gate line slit structures.

3. The 3D memory device according to claim 2, wherein:
a length of the first isolation structure along the third direction is greater than a distance of the two of the gate line slit structures along the third direction.

4. The 3D memory device according to claim 1, wherein:
a width of one of the gate line slit structures is greater than a width of one of the TSG cut structures along the third direction.

5. The 3D memory device according to claim 1, further comprising:
a second isolation structure in the isolation region and comprising second dielectric layers and third dielectric layers alternatingly stacked over each other.

6. The 3D memory device according to claim 5, wherein:
one of the first dielectric layers and a corresponding one of the second dielectric layers are on a same level, and one of the conductor layers and a corresponding one of the third dielectric layers are on a same level.

7. The 3D memory device according to claim 6, wherein:
the first dielectric layers and the second dielectric layers have a same material.

8. The 3D memory device according to claim 1, further comprising:
dummy channel hole structures extending through the stack in the first core region, wherein the TSG cut structures extend a portion of the dummy channel hole structures along the second direction, the one of the TSG cut structures being configured to connect multiple ones of the dummy channel hole structures along the first direction.

9. The 3D memory device according to claim 8, wherein:
a size of the dummy channel hole structures along the third direction is greater than a size of the TSG cut structures along the third direction.

10. The 3D memory device according to claim 1, further comprising at least two first isolation structures arranged along the first direction, wherein one of the at least two first isolation structures contacts with the gate line slit structures in the first core region, another one of the at least two first isolation structures contacts with the gate line slit structures in the second core region.

11. A three-dimensional (3D) memory device, comprising:
- a first core region, a second core region, and an isolation region between the first core region and the second core region along a first direction;
- a stack in the first core region and the second core region and comprising alternatingly stacked first dielectric layers and conductor layers;
- gate line slit structures extending through the stack along a second direction in the first core region and the second core region, the second direction perpendicular to the first direction; and
- a first isolation structure extending, along the second direction, through the stack that comprises alternatingly stacked first dielectric layers and conductor layers in the isolation region, wherein:
the first isolation structure contacts ends of at least two of the gate line slit structures and ends of at least two of TSG cut structures that extend through a portion of the stack along the second direction, the ends of the at least two of the gate line slit structures being flush with the ends of the at least two of the TSG cut structures to configure the first isolation structure to extend substantially along a third direction perpendicular to the first direction and the second direction.

12. The 3D memory device according to claim 11, further comprising:
- a second isolation structure in the isolation region and comprising second dielectric layers and third dielectric layers alternatingly stacked over each other.

13. The 3D memory device according to claim 1, wherein:
the one of the TSG cut structures is configured to connect multiple ones of dummy channel hole structures arranged along the first direction.

14. The 3D memory device according to claim 1, further comprising:
- channel structures disposed between one of the gate line slit structures and the one of the TSG cut structures; and
- one of the channel structures is aligned with one of dummy channel hole structures connected by the one of the TSG cut structure along the third direction.

15. The 3D memory device according to claim 1, wherein:
a sidewall of the first isolation structure is discontinuously contacted by the conductor layers of the stack.

16. A three-dimensional (3D) memory device, comprising:
- a first core region, a second core region, and an isolation region between the first core region and the second core region along a first direction;
- a stack in the first core region and the second core region and comprising alternatingly stacked first dielectric layers and conductor layers;
- gate line slit structures extending through the stack along a second direction in the first core region and the second core region, the second direction being perpendicular to the first direction; and
- a first isolation structure extending, along the second direction, through the stack that comprises alternatingly stacked first dielectric layers and conductor layers in the isolation region, wherein:
the first isolation structure contacts ends of at least two of the gate line slit structures and ends of at least two of TSG cut structures that extend through a portion of the stack along the second direction, the ends of the at least two of the gate line slit structures being flush with the ends of the at least two of the TSG cut structures to configure the first isolation structure to extend substantially along a third direction perpendicular to the first direction and the second direction; and
a width of the first isolation structure along a third direction is greater than a width of one of the gate line slit structures along the third direction, the third direction is perpendicular to the first direction and the second direction.

17. The 3D memory device according to claim 11, wherein:
- one of the TSG cut structures is configured to connect multiple ones of dummy channel hole structures arranged along the first direction;
- channel structures are disposed between one of the gate line slit structures and the one of the TSG cut structures; and
- one of the channel structures is aligned with one of the dummy channel hole structures connected by the one of the TSG cut structure along the third direction.

18. The 3D memory device according to claim 11, wherein:
a sidewall of the first isolation structure is discontinuously contacted by the conductor layers of the stack.

19. The 3D memory device according to claim 16, wherein:
- one of the TSG cut structures is configured to connect multiple ones of dummy channel hole structures arranged along the first direction;
- channel structures are disposed between one of the gate line slit structures and the one of the TSG cut structures; and
- one of the channel structures is aligned with one of the dummy channel hole structures connected by the one of the TSG cut structure along the third direction.

20. The 3D memory device according to claim 16, wherein:
a sidewall of the first isolation structure is discontinuously contacted by the conductor layers of the stack.

* * * * *